(12) United States Patent
Shih et al.

(10) Patent No.: US 11,194,188 B2
(45) Date of Patent: Dec. 7, 2021

(54) DISPLAY PANEL, DRIVER CIRCUIT, AND MANUFACTURING METHOD OF DISPLAY PANEL

(71) Applicant: Au Optronics Corporation, Hsinchu (TW)

(72) Inventors: Ping-Hung Shih, Hsinchu (TW);
Wei-Chieh Sun, Hsinchu (TW);
Peng-Che Tai, Hsinchu (TW);
Chia-Heng Chen, Kaohsiung (TW);
Jhih-Ci Chen, Hsinchu (TW);
Meng-Ting Hsieh, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 100 days.

(21) Appl. No.: 16/679,236

(22) Filed: Nov. 10, 2019

(65) Prior Publication Data

US 2020/0166797 A1 May 28, 2020

Related U.S. Application Data

(60) Provisional application No. 62/771,767, filed on Nov. 27, 2018.

(30) Foreign Application Priority Data

Mar. 29, 2019 (TW) .................. 108111231

(51) Int. Cl.
*G02F 1/1335* (2006.01)
*G02F 1/1333* (2006.01)
(Continued)

(52) U.S. Cl.
CPC ...... *G02F 1/133512* (2013.01); *G02F 1/1368* (2013.01); *G02F 1/13454* (2013.01);
(Continued)

(58) Field of Classification Search
CPC ... G09G 2300/0413; G09G 2300/0408; G09G 3/20; G09G 3/3611; G09G 2330/06;
(Continued)

(56) References Cited

U.S. PATENT DOCUMENTS 9,335,597 B2   5/2016   Cai et al.
9,589,996 B2   3/2017   Jin et al.
(Continued)

FOREIGN PATENT DOCUMENTS

CN   101232058   7/2008
CN   103472641   12/2013
(Continued)

*Primary Examiner* — Thoi V Duong
(74) *Attorney, Agent, or Firm* — JCIPRNET

(57) ABSTRACT

A display panel includes a substrate, a plurality of standard pixel units, and a plurality of dummy pixel units. A plurality of first conductor patterns and a plurality of shield blocks of a shield pattern layer are arranged in an array above the substrate. Each of the standard pixel units includes one of the first conductor patterns and a first shield block of the shield blocks. The first shield blocks and the first conductor patterns are overlapped, respectively. Each of the dummy pixel units includes a second shield block of the shield blocks. The second shield blocks and the first conductor patterns are not overlapped. A first edge of the substrate is spaced apart from a second edge of one of the standard pixel units adjacent to the dummy pixel units by a first distance. The first distance is within a range from 50 μm to 3000 μm.

19 Claims, 20 Drawing Sheets

(51) Int. Cl.
*G02F 1/1362* (2006.01)
*G02F 1/1343* (2006.01)
*G02F 1/1345* (2006.01)
*G02F 1/1368* (2006.01)
*H01L 27/32* (2006.01)
*G09G 3/36* (2006.01)

(52) U.S. Cl.
CPC .. *G02F 1/133351* (2013.01); *G02F 1/133388* (2021.01); *G02F 1/133514* (2013.01); *G02F 1/134336* (2013.01); *G02F 1/136286* (2013.01); *H01L 27/3272* (2013.01); *G02F 1/136295* (2021.01); *G02F 2201/123* (2013.01); *G09G 3/3611* (2013.01); *G09G 2300/0413* (2013.01)

(58) Field of Classification Search
CPC ............ H01L 27/3244; H01L 27/3223; H01L 27/3276; H01L 27/3272; H01L 27/326; H01L 51/5284; G02F 1/133512; G02F 1/136286; G02F 1/1333; G02F 1/133351; G02F 1/133388; G02F 1/134336; G02F 1/134309; G02F 1/1345; G02F 1/133514; G02F 1/1368; G02F 1/13454; G02F 1/1362; G02F 1/136295; G02F 2201/123
See application file for complete search history.

(56) References Cited

U.S. PATENT DOCUMENTS

| | | | |
|---|---|---|---|
| 9,608,014 | B2 | 3/2017 | Jin et al. |
| 10,115,636 | B2 | 10/2018 | Nishida et al. |
| 2010/0214195 | A1* | 8/2010 | Ogasawara ....... G02F 1/136286 345/55 |
| 2014/0211136 | A1* | 7/2014 | Fukuoka ............. G02F 1/13394 349/106 |
| 2015/0287748 | A1 | 10/2015 | Jin et al. |
| 2015/0287751 | A1 | 10/2015 | Jin et al. |
| 2015/0309381 | A1 | 10/2015 | Cai et al. |
| 2016/0042962 | A1 | 2/2016 | Nishida et al. |
| 2017/0261798 | A1 | 9/2017 | Li |
| 2019/0317347 | A1 | 10/2019 | Huang et al. |

FOREIGN PATENT DOCUMENTS

| | | |
|---|---|---|
| CN | 103943660 | 7/2014 |
| CN | 104199216 | 12/2014 |
| CN | 105304042 | 2/2016 |
| CN | 106252418 | 12/2016 |
| CN | 206096692 | 4/2017 |
| CN | 108873398 | 11/2018 |
| TW | 200826174 | 6/2008 |
| TW | 201608621 | 3/2016 |

\* cited by examiner

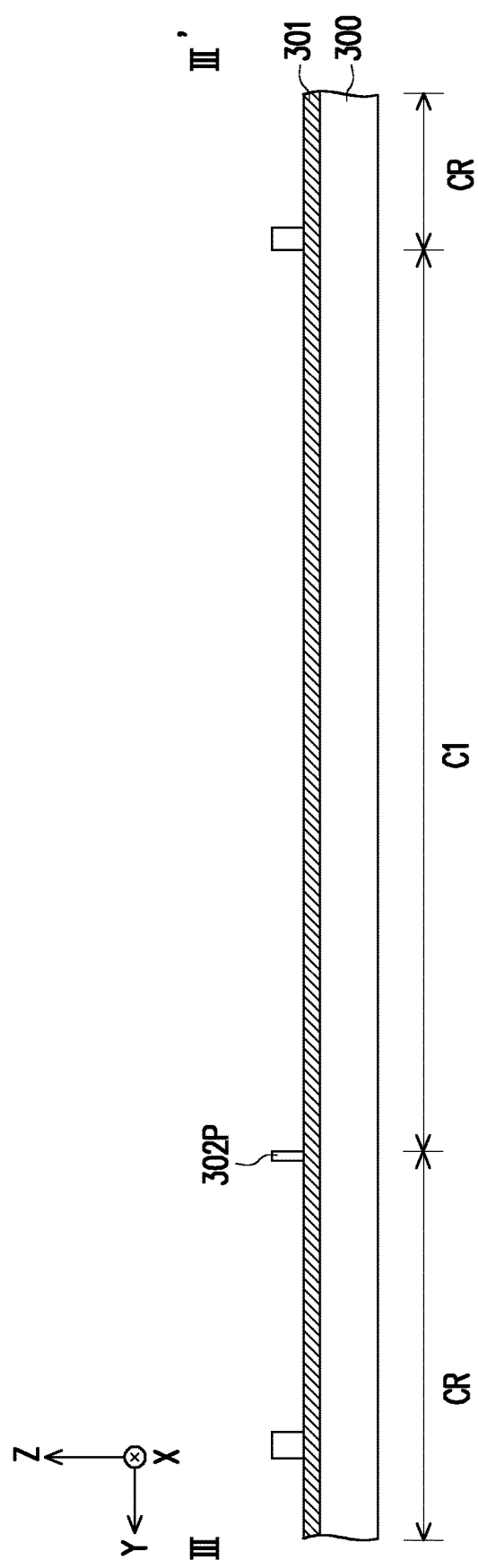
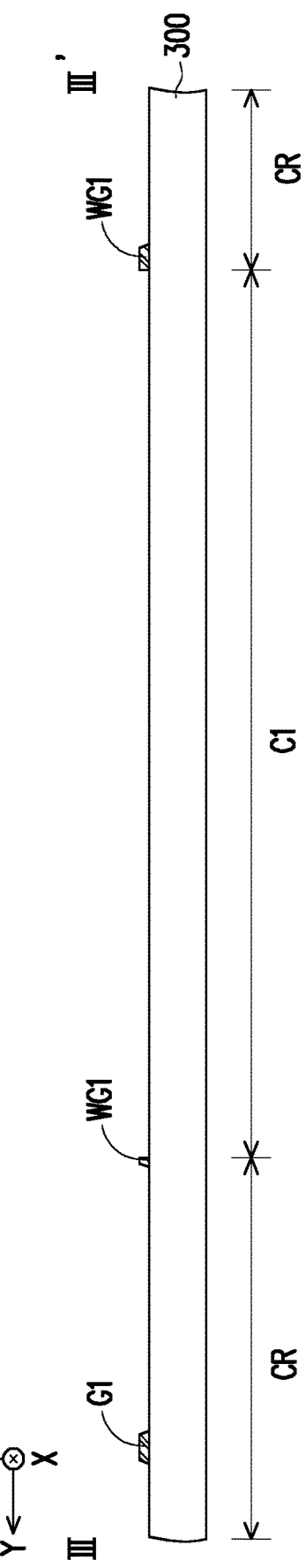
FIG. 3C
FIG. 3D

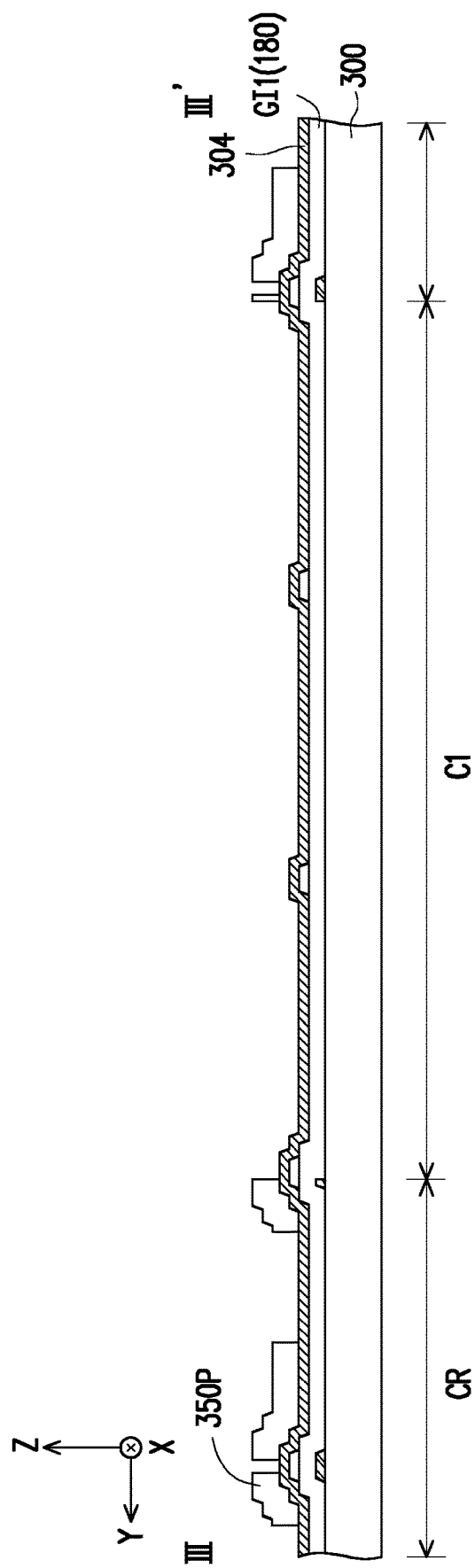
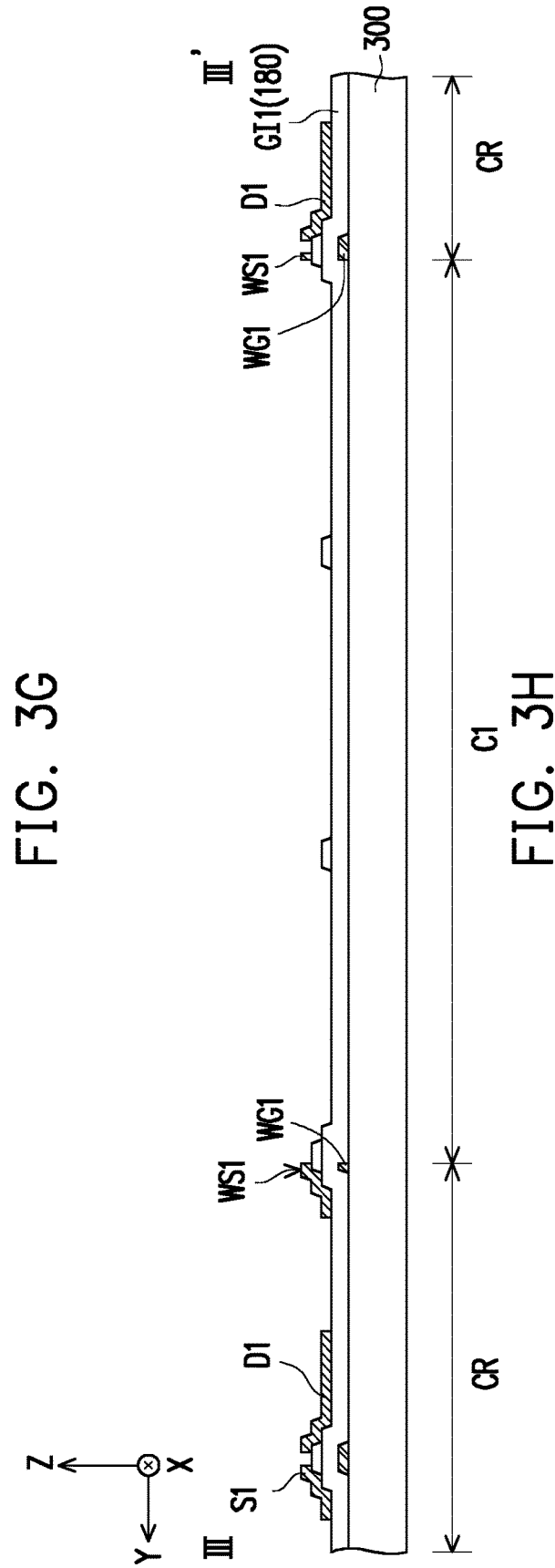

DISPLAY PANEL, DRIVER CIRCUIT, AND MANUFACTURING METHOD OF DISPLAY PANEL

CROSS-REFERENCE TO RELATED APPLICATION

This application claims the priority benefit of U.S. provisional application Ser. No. 62/771,767, filed on Nov. 27, 2018, and Taiwan application serial no. 108111231, filed on Mar. 29, 2019. The entirety of each of the above-mentioned patent applications is hereby incorporated by reference herein and made a part of this specification.

BACKGROUND

Technical Field

The disclosure relates to an electronic apparatus, and more particularly, to a display panel, a driver circuit, and a manufacturing method of the display panel.

Description of Related Art

A liquid crystal display (LCD) panel may be composed of an opposite substrate, an array substrate, and a liquid crystal layer located between the two substrates. In order to improve the manufacturing efficiency, the existing LCD panel is mostly formed by assembling an array substrate sheet and an opposite substrate sheet and sealing the liquid crystal material therebetween to form a mother sheet having a plurality of display panels. The mother sheet is then cut to form a plurality of independent display panels.

In response to a wide range of product requirements, the sizes of the display panels often have different designs. Manufacturing the existing LCD panel requires the development of photomasks for display panels of different sizes; hence, the manufacturing costs cannot be reduced, and it is not conducive to customizing the display panels of special sizes.

SUMMARY

An embodiment of the disclosure provides a display panel having a structure conducive to increasing the flexibility of forming the display panel of different sizes, resolving the issue of corrosion of conductor materials after the process of cutting the display panel is performed, and preventing the issue of short circuit of different layers or components in the process of cutting the display panel.

In an embodiment of the disclosure, a display panel including a substrate, a plurality of standard pixel units, and a plurality of dummy pixel units is provided. A plurality of first conductor patterns and a plurality of shield blocks of a shield pattern layer are arranged in an array above the substrate. Each of the standard pixel units includes a first conductor pattern of the first conductor patterns and a first shield block of the shield blocks. The first shield blocks and the first conductor patterns are overlapped, respectively. Each of the dummy pixel units includes a second shield block of the shield blocks, the second shield blocks and the first conductor patterns are not overlapped, a first edge of the substrate is spaced apart from a second edge of one of the standard pixel units adjacent to the dummy pixel units by a first distance, and the first distance is within a range from 50 µm to 3000 µm.

An embodiment of the disclosure provides a driver circuit with a structure conducive to improvement of yield of a driver circuit cutting process and prevention of signal interference.

In an embodiment of the disclosure, a driver circuit including a plurality of stage circuits and a plurality of stage connection wires is provided. Each of the stage circuits includes a plurality of active devices. A first stage connection wire of the stage connection wires on the outermost side is electrically connected between two of the stage circuits, a segment of the first stage connection wire is disposed adjacent to a clearance region, the clearance region is located between two adjacent stage circuits of the stage circuits, the active devices vacate the clearance region, a length of clearance region is within a range from 50 µm to 150 µm, and a width of the clearance region is within a range from 50 µm to 150 µm.

An embodiment of the disclosure provides a driver circuit with a structure conducive to improvement of yield of a driver circuit cutting process and prevention of signal interference.

In an embodiment of the disclosure, a driver circuit including a plurality of stage circuits and a plurality of stage connection wires is provided. Each of the stage circuits includes a plurality of active devices. A first stage connection wire of the stage connection wires is electrically connected between two of the stage circuits, the first stage connection wire has a first segment and a second segment, the first segment is located between two adjacent stage circuits of the stage circuits, and a line width of the first segment is less than a line width of the second segment.

An embodiment of the disclosure provides a manufacturing method of a display panel. The display panel has a structure conducive to increasing the flexibility of forming the display panel of different sizes, resolving the issue of corrosion of conductor materials after the process of cutting the display panel is performed, and preventing the issue of short circuit of different layers or components in the process of cutting the display panel.

In an embodiment of the disclosure, a manufacturing method of a display panel is provided, and the method includes providing a substrate material layer, forming a plurality of standard pixel units and a plurality of dummy pixel units, and cutting the substrate material layer along at least one cutting surface. Here, a plurality of first conductor patterns and a plurality of shield blocks of a shield pattern layer are arranged in an array above the substrate material layer, each of the standard pixel units includes one of the first conductor patterns and a first shield block of the shield blocks, the first shield blocks and the first conductor patterns are overlapped, respectively, each of the dummy pixel units includes a second shield block of the shield blocks, and the second shield blocks and the first conductor patterns are not overlapped; and one of the at least one cutting surface is spaced apart from a first edge of one of the standard pixel units adjacent to the dummy pixel units by a first distance, and the first distance is within a range from 50 µm to 3000 µm.

In the display panel provided in one or more embodiments of the disclosure, the pre-cutting region merely includes the dummy pixel units lacking specific materials (e.g., conductor materials); therefore, after the display panel cutting process is performed, there is no exposed conductor material on the edge of the resultant display panel, so as to prevent the issue of short circuit of different layers or components in the process of cutting the display panel and the issue of corrosion of the conductor materials after the process of cutting the display panel is performed. As such, good display quality may be guaranteed. Additionally, to prevent signal interference, the driver circuit cutting process is performed after the display panel cutting process, so as to cut off the stage connection wires. The stage connection wires have the segments with different widths, or the pre-cutting segments of the stage connection wires may be arranged away from other components, so as to improve the yield of the driver circuit cutting process.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 3A to FIG. 3I are schematic cross-sectional views of a manufacturing process of a portion of a mother sheet according to an embodiment of the disclosure.

DESCRIPTION OF THE EMBODIMENTS

In the following embodiments, wordings used to indicate directions, such as "up," "down," "front," "back," "left," and "right", merely refer to directions in the accompanying drawings. Hence, these terms are merely explanatory but are not restrictive. In the accompanying drawings, each figure illustrates the general features of the methods, structures, and/or materials used in the specific exemplary embodiments. The figures should not be construed as definition or limitation to the scope and property coveted by the specific exemplary embodiments. For instance, relative sizes, thicknesses, and locations of layers, regions, and/or structures may be reduced or enlarged for clarity.

In the embodiments, the same or similar components are marked by the same or similar reference numbers or symbols, and descriptions thereof will be omitted. In addition, the features of different exemplary embodiments may be combined with each other when they are not in conflict, and simple equivalent changes and modifications made according to the specification or the claims are still within the scope of the disclosure. Besides, the terms such as "first" and "second" mentioned in the specification or the claims are only used to name discrete components or to distinguish different embodiments or scopes and are not intended to limit the upper or lower limit of the number of the components, nor are they intended to limit the manufacturing order or arrangement order of the components.

Figure 1A:
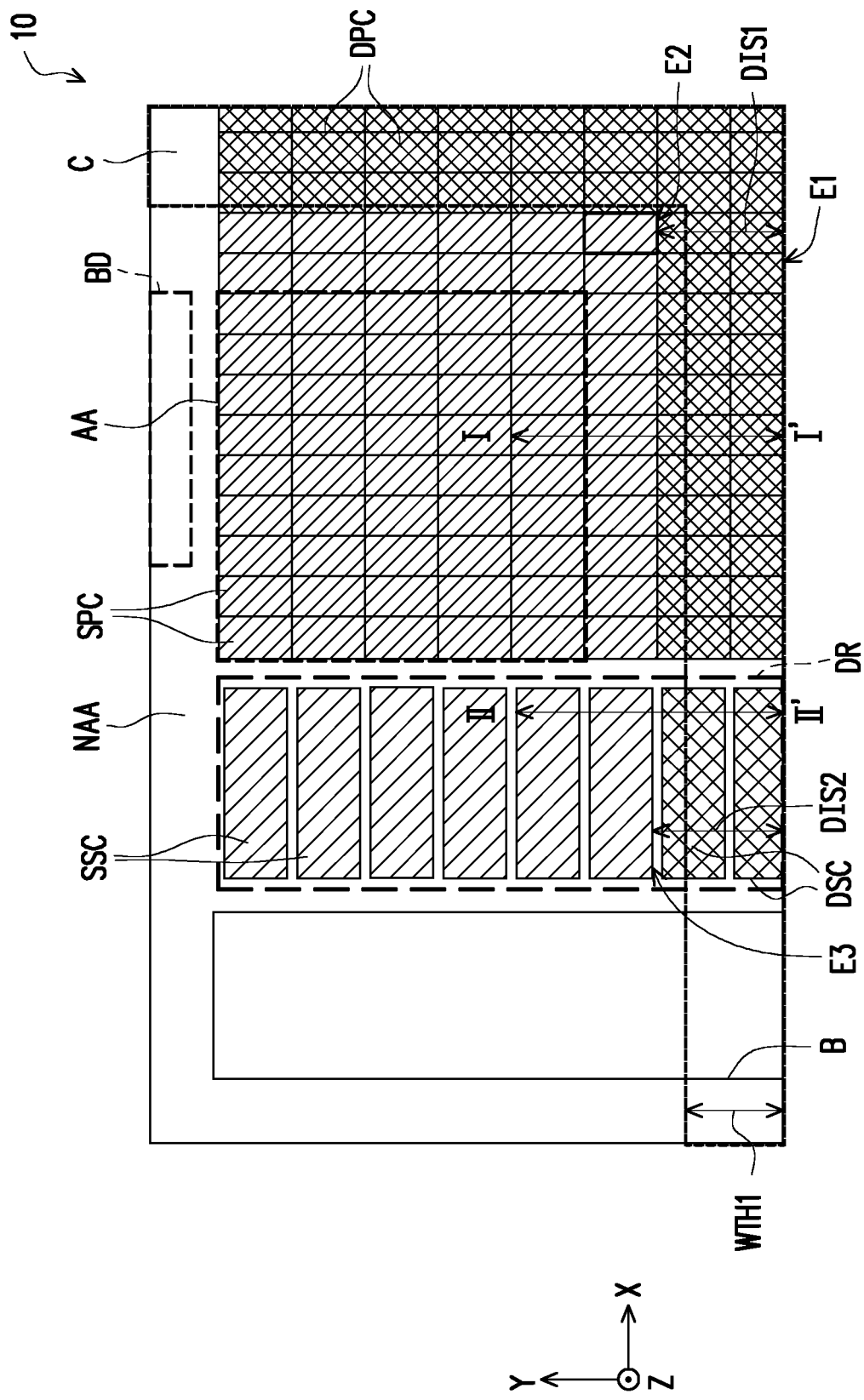
FIG. 1A is a schematic top view of a display panel according to an embodiment of the disclosure.
Figure 1B:
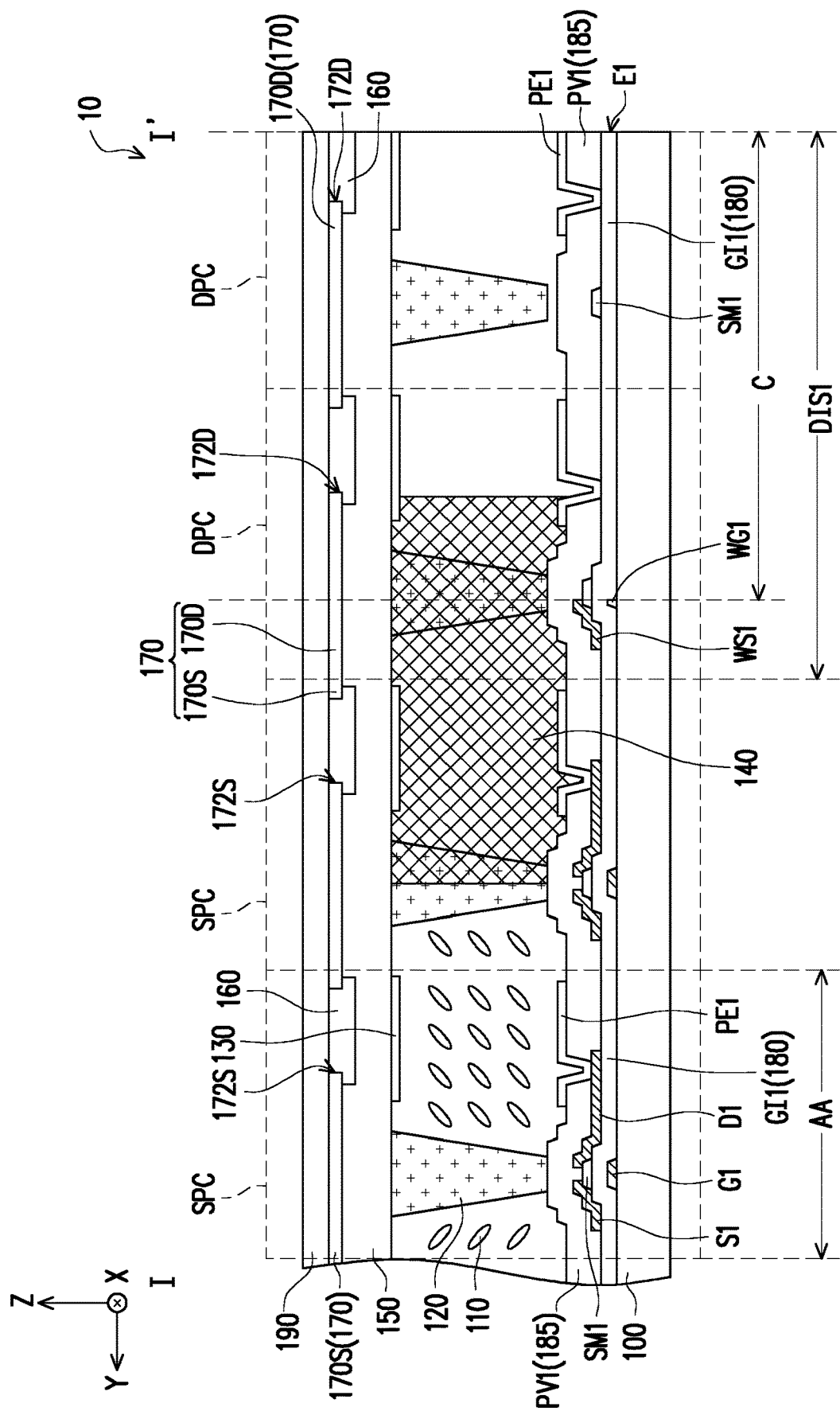
FIG. 1B and FIG. 1C are schematic cross-sectional views respectively taken along the sectional lines I-I' and II-II' in FIG. 1A.
Figure 1C:
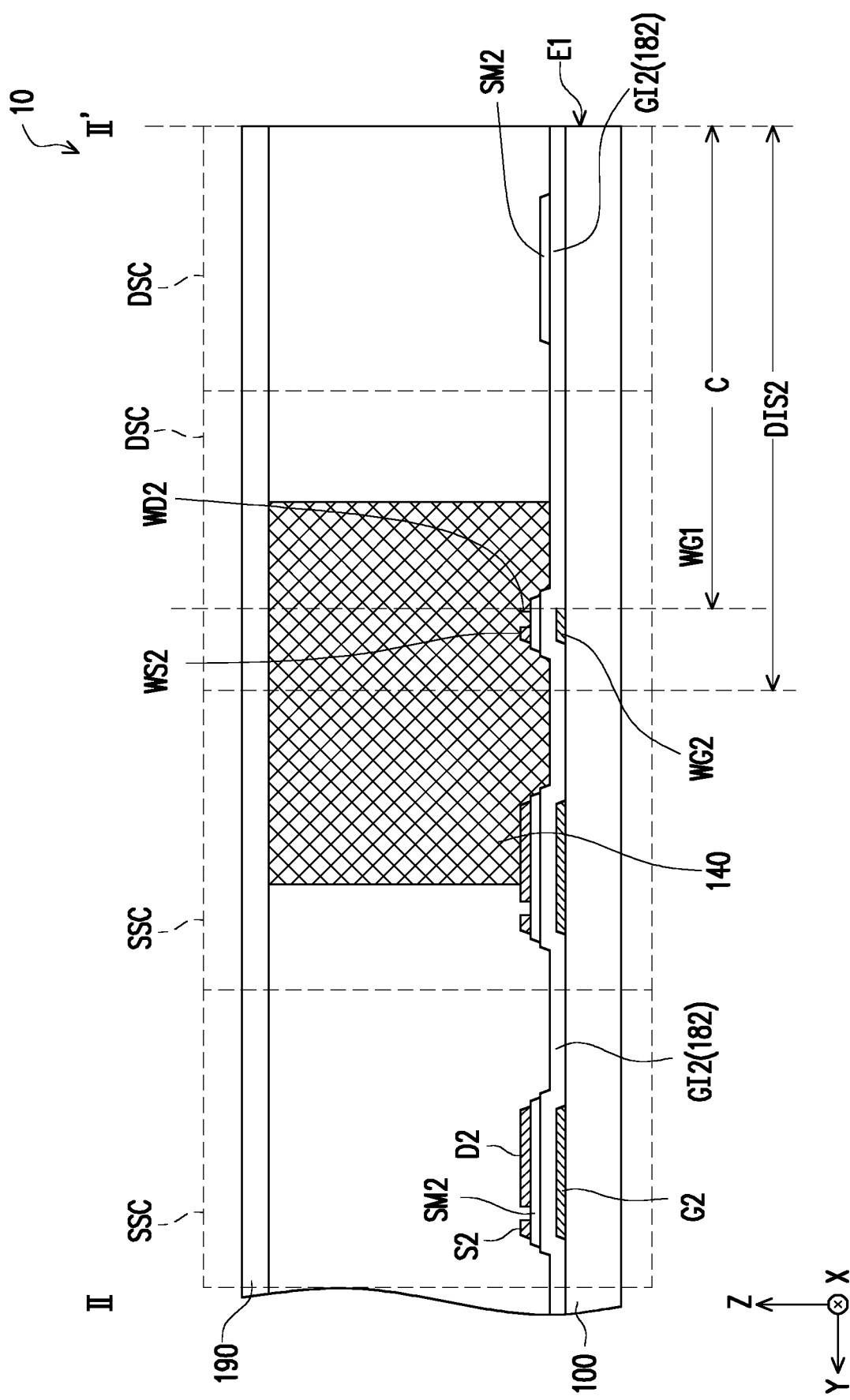

FIG. 1A is a schematic top view of a display panel 10 according to an embodiment of the disclosure. FIG. 1B is a schematic cross-sectional view taken along a sectional line I-I' in FIG. 1A. FIG. 1C is a schematic cross-sectional view taken along a sectional line II-II' in FIG. 1A. With reference to FIG. 1A, the display panel 10 may have a display region AA and a non-display region NAA located around the display region AA, wherein the non-display region NAA may include a driver circuit region DR, a peripheral circuit region B located on one side of the driver circuit region DR, a bonding region BD, and a pre-cutting region C. With reference to FIG. 1A to FIG. 1C, the display panel 10 may include substrates 100 and 190, standard pixel units SPC, dummy pixel units DPC, standard stage circuits SSC, dummy stage circuits DSC, a display medium 110, a support structure 120, a conductive layer 130, an adhesion layer 140, a planarization layer 150, a shield pattern layer 170, and insulation layers 180, 182, and 185. Namely, the pixel units may be categorized into the standard pixel units SPC and the dummy pixel units DPC, and the stage circuits may be categorized into the standard stage circuits SSC and the dummy stage circuit DSC. Here, the shield pattern layer 170 may be divided into a plurality of shield blocks 170S and 170D, each of the shield blocks 170S has a closed opening 172S, and each of the shield blocks 170D has a closed opening 172D, so that each of the shield blocks 170S and 170D is shaped as a hollow rectangle. Similarly, the insulation layer 180 may be divided into a plurality of insulation blocks GI1, the insulation layer 182 may be divided into a plurality of insulation blocks GI2, and the insulation layer 185 may be divided into a plurality of insulation blocks PV1.

The difference between the standard pixel units SPC and the dummy pixel units DPC lies in that the components therein are not completely the same. Each of the standard pixel units SPC may include conductor patterns G1, S1, and D1, a semiconductor pattern SM1, a pixel electrode PE1, a color filter pattern 160, the shield block 170S of the shield pattern layer 170, the insulation block GI1 of the insulation layer 180, and the insulation block PV1 of the insulation layer 185. Each of the dummy pixel units DPC includes the semiconductor pattern SM1, the pixel electrode PE1, the color filter pattern 160, the shield block 170D of the shield pattern layer 170, the insulation block GI1 of the insulation layer 180, and the insulation block PV1 of the insulation layer 185; besides, each of the dummy pixel units DPC may selectively include dummy conductor patterns WG1 and WS1. In other words, each of the dummy pixel units DPC does not include the conductor patterns G1, S1, and D1, i.e., each of the dummy pixel units DPC lacks certain layer(s) or component(s) of (one of) the standard pixel units SPC. Here, the dummy conductor patterns WG1 and WS1 of the dummy pixel units DPC are the remaining portion of the conductor patterns G1 and D1 of the standard pixel units SPC; that is, the shape and size of the dummy conductor patterns WG1 and WS1 are partially similar to those of the conductor patterns G1 and D1. Although the dummy pixel unit DPC depicted on the left-hand side of FIG. 1B is not completely the same as the dummy pixel unit DPC depicted on the right-hand side of FIG. 1B, note that neither of them includes the conductor patterns G1, S1, and D1 of the standard pixel units SPC. The functions and effects of the dummy pixel units DPC on the left-hand side and the right-hand side of FIG. 1B are similar. For clear illustration and to better emphasize the difference between the dummy pixel units DPC and the standard pixel unit SPC, the dummy pixel units DPC on the left-hand side and the right-hand side of FIG. 1B share the same reference numbers or symbols.

The difference between the standard pixel units SPC and the dummy pixel units DPC lies in that the corresponding relationships of components therein are not completely the same. Here, one of the standard pixel units SPC includes the conductor patterns G1, S1, and D1, and therefore the shield block 170S (or the color filter pattern 160) of one of the standard pixel units SPC and the conductor patterns G1, S1, and D1 may be overlapped. None of the dummy pixel units DPC include the conductor patterns G1, S1, and D1 of the standard pixel units SPC, and therefore the shield block 170D (or the color filter pattern 160) of each of the dummy pixel units DPC and the conductor patterns G1, S1, and D1 are not overlapped.

Similarly, the difference between the standard pixel units SPC and the dummy pixel units DPC lies in that the components therein are not completely the same. Each of the standard stage circuits SSC may include conductor patterns G2, S2, and D2, a semiconductor pattern SM2, and an insulation block GI2 of the insulation layer 182. Each of the dummy stage circuits DSC includes the semiconductor pattern SM2 and the insulation block GI2 of the insulation layer 182; besides, each of the dummy stage circuits DSC may selectively include dummy conductor patterns WG2, WS2, and WD2. In other words, each of the dummy stage circuits DSC does not include the conductor patterns G2, S2, and D2, i.e., each of the dummy stage circuits DSC lacks certain layer(s) or component(s) of (one of) the standard stage circuits SSC. Here, the dummy conductor patterns WG2, WS2, and WD2 of the dummy stage circuits DSC are the remaining portion of the conductor patterns G2, S2, and D2 of the standard stage circuits SSC; that is, the shape and size of the dummy conductor patterns WG2, WS2, and WD2 are partially similar to those of the conductor patterns G2, S2, and D2. Although the dummy stage circuit DSC depicted on the left-hand side of FIG. 1C is not completely the same as the dummy stage circuit DSC depicted on the right-hand side of FIG. 1C, note that neither of them includes the conductor patterns G1, S2, and D2 of the standard stage circuits SSC. The functions and effects of the dummy stage circuits DSC on the left-hand side and the right-hand side of FIG. 1C are similar. For clear illustration and to better emphasize the difference between the dummy stage circuits DSC and the standard stage circuits SSC, the dummy stage circuits DSC on the left-hand side and the right-hand side of FIG. 1C share the same reference numbers or symbols.

The standard pixel units SPC, the dummy pixel units DPC, the standard stage circuits SSC, and the dummy stage circuits DSC are arranged in a specific manner. Specifically, as shown in FIG. 1A, the display region AA merely has the standard pixel units SPC; the non-display region NAA may selectively have the standard pixel units SPC. Besides, the dummy pixel units DPC and the standard pixel units SPC are closely arranged to form a matrix; hence, the layer(s) or component(s) included in the dummy pixel units DPC and the standard pixel units SPC are also regularly arranged. For instance, the color filter patterns 160, the conductor patterns G1, S1, and D1, and the shield blocks 170S and 170D are arranged in an array above the substrate 100. Similarly, the dummy stage circuits DSC and the standard stage circuits SSC are also arranged in an array. In particular, according to some embodiments, one standard stage circuit SSC may correspond to one or a plurality of standard pixel units SPC, and one dummy stage circuit DSC may correspond to one or a plurality of dummy pixel units DPC. The adhesion layer 140 and a portion of the dummy pixel units DPC or a portion of the dummy stage circuits DSC may be overlapped; moreover, the adhesion layer 140 and a portion of the standard pixel units SPC or a portion of the standard stage circuits SSC may also be overlapped; for instance, in FIG. 1C, the adhesion layer 140 and one standard stage circuit SSC are overlapped, which should however not be construed as a limitation in the disclosure. The adhesion layer 140 may overlap two to four standard stage circuits SSC.

As shown in FIG. 1A, based on manufacturing precision, the display panel 10 reserves a pre-cutting region C on its edge, so as to prevent the layers or components in the display region AA from being damaged in the display panel cutting process. Under the circumstances, an edge of the pre-cutting region C may be aligned to a portion of the edge (e.g., the edge E1) of the substrate 100. Besides, the pre-cutting region C and the driver circuit region DR and the peripheral circuit region B may be partially overlapped; however, the pre-cutting region C and the display region AA are separated from each other and are not overlapped. In other embodiments, not the standard pixel units SPC and the standard stage circuits SSC but the dummy pixel units DPC and the dummy stage circuits DSC are disposed in the pre-cutting region C of the non-display region NAA. In other embodiments, the pre-cutting region C of the non-display region NAA does not have layer(s) or component(s) made of certain materials, e.g., the layer(s) or component(s) made of metal or conductor materials. In other embodiments, since the dummy pixel units DPC and the dummy stage circuits DSC located on the edge (e.g., the edge E1) of the substrate 100 do not have the layer(s) or component(s) made of metal or conductor materials (e.g., the conductor patterns G1, G2, S1, S2, D1, and D2), no metal or conductor materials are exposed on the edge of the display panel 10 formed through performing the display panel cutting process, so as to prevent the issue of short circuit of the process of cutting the display panel and the issue of corrosion after the process of cutting the display panel, and display quality may be guaranteed. Similarly, there is no layer(s) or component(s) made of metal or conductor materials at a region where the peripheral circuit region B and the pre-cutting region C are overlapped. In some embodiments, the edges of the dummy stage circuits DSC located on the edge (i.e., the edge E1) of the substrate 100 and the edges of the dummy pixel units DPC located on the edge (i.e., the edge E1) of the substrate 100 are aligned to the edge (i.e., the edge E1) of the substrate 100.

The width of the pre-cutting region C may be adjusted according to the manufacturing precision. In some embodiments, the width WTH1 of the pre-cutting region C is within a range from 50 micrometers ($\mu$m) to 3000 $\mu$m. In some embodiments, each segment of the pre-cutting region C may have the same width; in other embodiments, different segments of the pre-cutting region C may have different widths. In some embodiments, the range of the pre-cutting region C may be substantially defined by a distance DIS1 between the edge E1 of the substrate 100 and the edge E2 of the standard pixel unit SPC adjacent to the dummy pixel units DPC. In some embodiments, the distance DIS1 is greater than or equal to 50 $\mu$m; in other embodiments, the distance DIS1 is within a range from 50 $\mu$m to 3000 $\mu$m. In some embodiments, the range of the pre-cutting region C may be substantially defined by a distance DIS2 between the edge E1 of the substrate 100 and the edge E3 of the standard stage circuit SSC adjacent to the dummy stage circuits DSC. In some embodiments, the distance DIS2 is greater than or equal to 50 µm; in other embodiments, the distance DIS2 is within a range from 50 µm to 3000 µm. In FIG. 1B, note that the edges (e.g., the edge E2) of the standard pixel units SPC and the dummy pixel units DPC is respectively defined according to the edges of the shield blocks 170S and 170D; in other embodiments, the edges of the standard pixel units SPC and the dummy pixel units DPC may be respectively defined according to the edges of the color filter patterns 160; in other embodiments, the edges of the standard pixel units SPC may also be defined according to the edges of the pixel electrodes PE1, and the dummy pixel units DPC and the standard pixel units SPC are of similar sizes.

Figure 2:
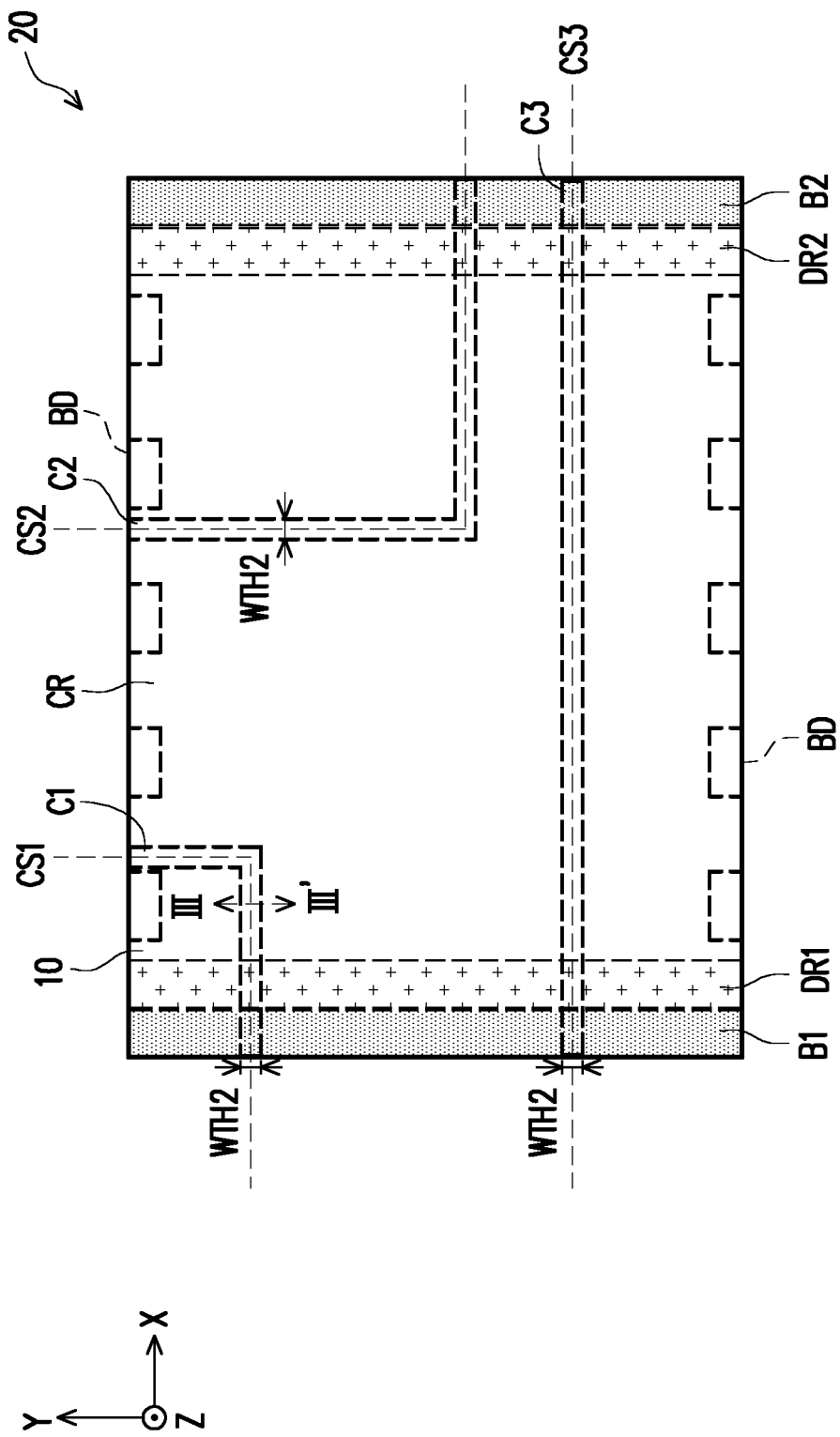
FIG. 2 is a schematic top view of a display panel according to an embodiment of the disclosure.

To improve manufacturing flexibility and yield of the display panel 10 of an arbitrary size, a mother sheet configured to form the display panel 10 may be further designed, so as to ensure the display quality of the display panel 10 while cutting the mother sheet to form the display panel 10 of arbitrary size. Particularly, FIG. 2 is a schematic top view of the display panel 10 according to an embodiment of the disclosure. With reference to FIG. 2, a mother sheet 20 may have a central region CR, pre-cutting regions C1-C3, a bonding region BD, driver circuit regions DR1 and DR2 located on two sides of the central region CR, and peripheral circuit regions B1 and B2. The pre-cutting regions C1-C3 and the central region CR, the driver circuit regions DR1 and DR2, and the peripheral circuit regions B1 and B2 are partially overlapped, respectively. In some embodiments, the pre-cutting regions C1-C3 may have the same width; in other embodiments, the pre-cutting regions C1-C3 may have different widths. In some embodiments, the width WTH2 of the pre-cutting regions C1-C3 is within a range from 50 µm to 3500 µm. The mother sheet 20 is configured to form the display panel 10, and therefore the display panel 10 in FIG. 1A is shown on the upper-left corner of FIG. 2. To be specific, cutting surfaces CS1-CS3 are respectively located in the pre-cutting regions C1-C3, and the cutting surface CS1 may define or demarcate the display panel 10 from the mother sheet 20. It may be learned from the above that the mother sheet 20 includes a plurality of standard pixel units (not shown in FIG. 2), a plurality of dummy pixel units (not shown in FIG. 2), a plurality of standard stage circuits (not shown in FIG. 2), and a plurality of dummy stage circuits (not shown in FIG. 2). Here, the dummy stage circuits are disposed at a region where the driver circuit regions DR1 and DR2 and the pre-cutting regions C1-C3 are overlapped, and the standard stage circuits are disposed at the remaining driver circuit regions DR1 and DR2. The dummy pixel units are disposed at a region where the central region CR and the pre-cutting regions C1-C3 are overlapped, the standard pixel units are disposed at the remaining central region CR. The standard pixel units, the dummy pixel units, the standard stage circuits, and the dummy stage circuits are arranged in an array.

To elaborate the technical content of the mother sheet 20 and the display panel 10 In the embodiment, a manufacturing method of the mother sheet 20 is described below with reference to FIG. 3A to FIG. 3I, and a manufacturing method of the display panel 10 is described below with reference to FIG. 4. FIG. 3A to FIG. 3I are schematic cross-sectional views of a manufacturing process of a portion of the mother sheet 20 according to an embodiment of the disclosure, and the cross-sectional locations shown in FIG. 3A to FIG. 3I correspond to the locations of the sectional line depicted in FIG. 2.

Figure 3A:
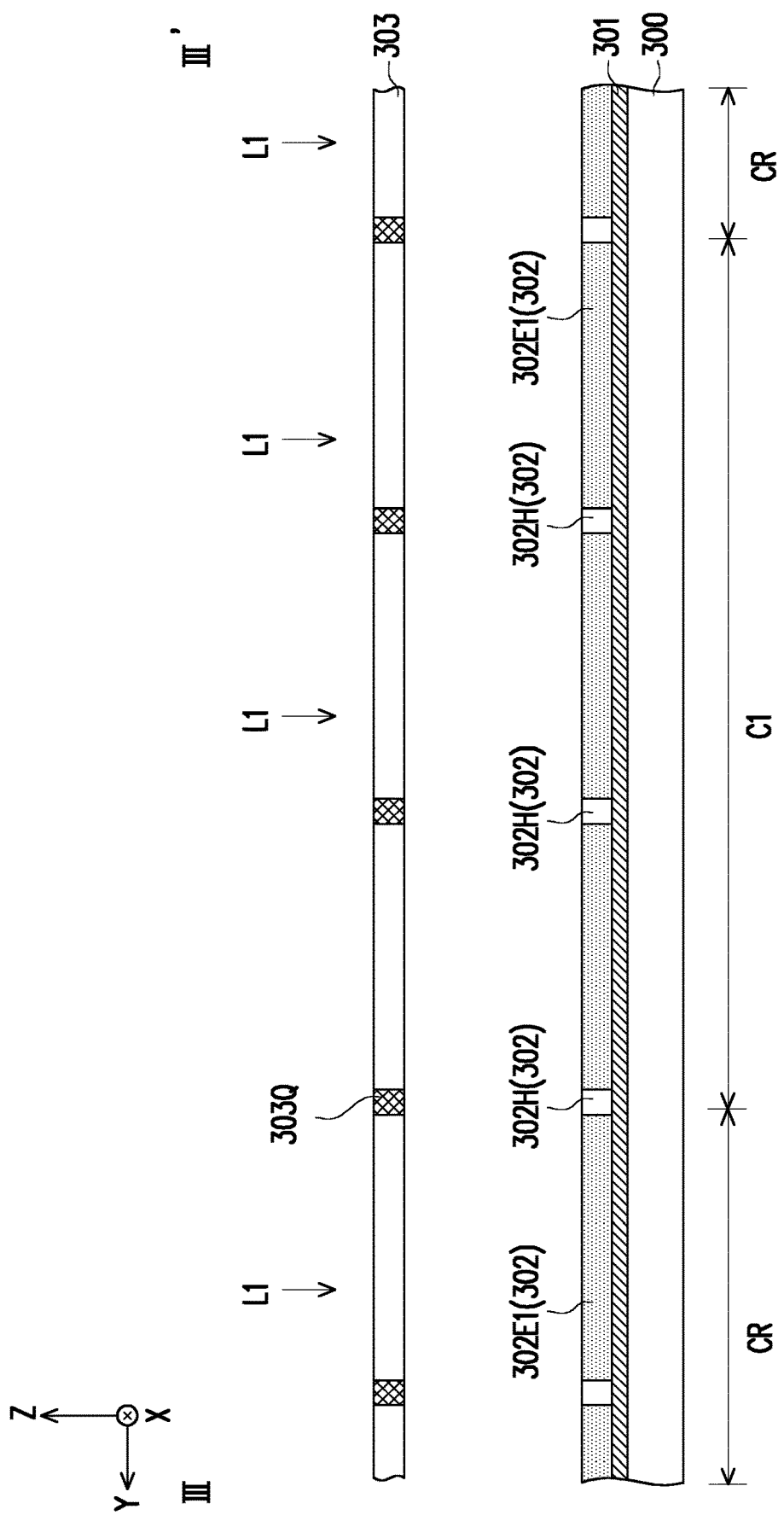

With reference to FIG. 3A, a substrate material layer 300 is provided. The substrate material layer 300 may be a rigid substrate, e.g., a glass substrate, a quartz substrate, or a silicon substrate, or may be a flexible substrate, e.g., a polymer substrate or a plastic substrate. A conductor material layer 301 is then continuously formed on the substrate material layer 300. That is, in the embodiment, the conductor material layer 301 may be located in the central region CR; however, in other embodiments, the conductor material layer 301 may also be located in the central region CR, the driver circuit regions DR1 and DR2, and the peripheral circuit regions B1 and B2. In consideration of conductivity, the conductor material layer 301 is normally made of a metallic material or alloy, metal nitride, metal oxide, metal oxynitride, or another conductor material.

A photoresist material layer 302 is then continuously formed on the entire conductor material layer 301, and the conductor material layer 301 and the photoresist material layer 302 are completely overlapped. After the photoresist material layer 302 is formed on the conductor material layer 301, two exposure processes and one development process are performed. According to the present embodiment, in the first exposure process, an exposure beam L1 with evenly distributed illuminance irradiates a photoresist material layer 302 through a first photomask 303, so as to form first non-exposure regions 302H and first exposure regions 302E1 on the photoresist material layer 302. Here, the first photomask 303 at least has an opaque photoresist pattern 303Q. In the embodiment, the shape of each first non-exposure region 302H is the same, and the shape of the first non-exposure regions 302H is the same as the shape of the conductor patterns G1 depicted in FIG. 1B; in other words, according to the present embodiment, the first non-exposure regions 302H having the same size and arranged in an array are formed in the central region CR of the mother sheet 20; thereby, the mother sheet 20 may be cut to form the display panel of arbitrary size, and the size of the display panel is irrelevant to the pattern of the first photomask 303 (or the first exposure regions 302E1).

Figure 3B:
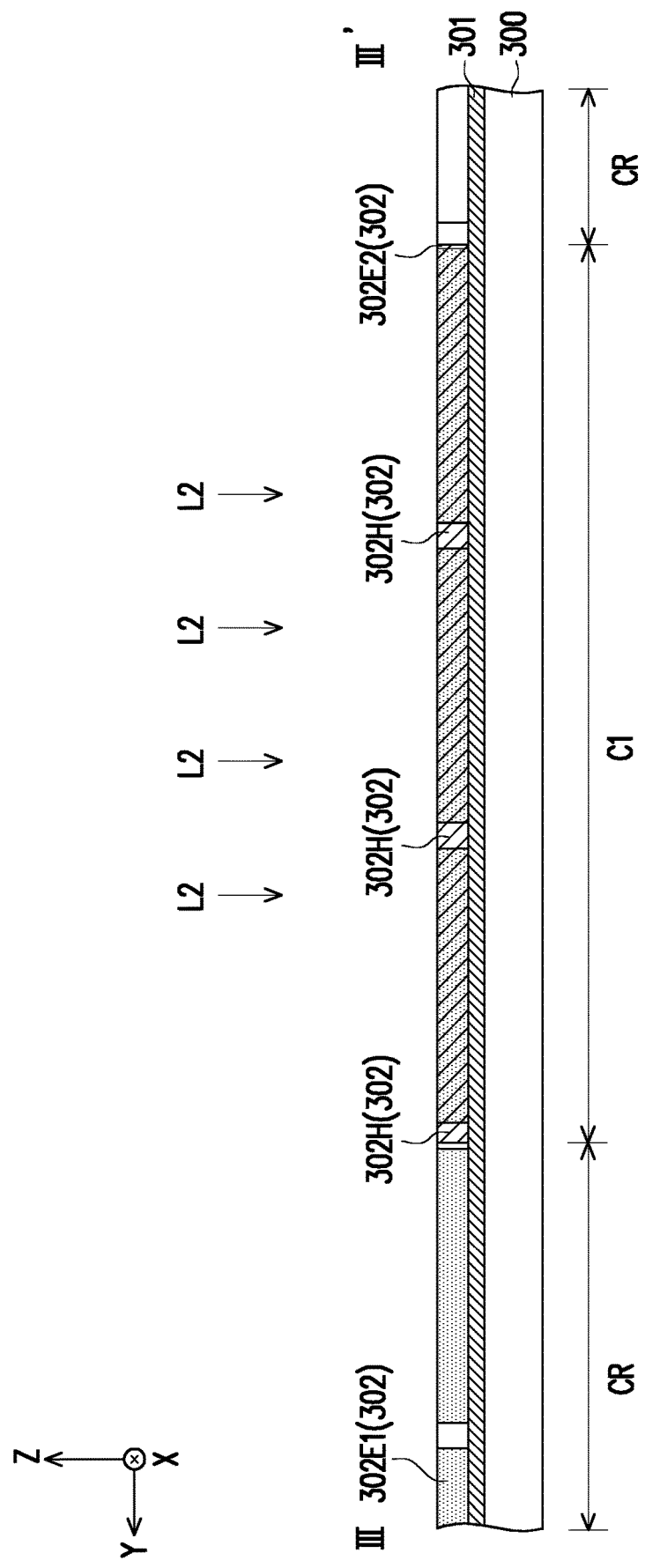

With reference to FIG. 3B, the second exposure process is performed to form at least one second exposure region 302E2 on the photoresist material layer 302. In the embodiment, the shape and the size of the second exposure region 302E2 are completely the same as those of the pre-cutting region C1. Besides, in the embodiment, the second exposure region 302E2 may be partially or completely overlapped with a portion of the first non-exposure regions 302H and a portion of the first exposure regions 302E1; in other embodiments, the second exposure region 302E2 is partially or completely overlapped with a portion of the first non-exposure regions 302H or a portion of the first exposure regions 302E1. In other words, the mother sheet 20 may be cut to form the display panel of any size according to the shape of the second exposure region 302E2, and the size of the display panel is relevant to the pattern of the second exposure region 302E2. In some embodiments, an exposure beam L2 such as a laser beam provided by an exposure machine such as an edge exposure machine directly irradiates a portion of the photoresist material layer 302 in the second exposure process; that is, the exposure beam L2 has the focused illuminance distributed in the second exposure region 302E2 and thus no additional photomask is required. However, this should not be construed as a limitation in the disclosure; in other embodiments, the exposure beam L1 with the evenly distributed illuminance may be applied together with one second photomask (not shown) to generate the exposure beam L2 irradiating the photoresist material layer 302 in the second exposure process.

As shown in FIG. 3C, one development process is performed on the photoresist material layer 302 to form a patterned photoresist layer 302P. With reference to FIG. 3D, an etching process is performed on the conductor material layer 301 with use of the patterned photoresist layer 302P as a mask, and after the etching process is performed to form the conductor patterns G1 and the dummy conductor patterns WG1, the patterned photoresist layer 302P is removed. Here, a method of removing the patterned photoresist layer 302P may be a wet photoresist removal method or a dry photoresist removal method. As such, the conductor material layer 301 may be patterned according to the first exposure regions 302E1 and the second exposure region 302E2 to form the dummy conductor patterns WG1 and the conductor patterns G1 as shown in FIG. 1B. Here, the shape of the projection of the conductor patterns G1 on the substrate material layer 300 is the same as the shape of the projection of the first non-exposure regions 302H on the substrate material layer 300, and the shape of the projection of the dummy conductor patterns WG1 on the substrate material layer 300 is the same of the shape of the projection of the first non-exposure regions 302H excluding the shape of the projection of the second exposure region 302E2 on the substrate material layer 300 (that is to say, the shape of the projection of a remaining region after the second exposure region 302E2 is subtracted from the first non-exposure regions 302H on the substrate material layer 300). In the embodiment, the conductor patterns G1 located at the central region CR of the mother sheet 20 are formed by performing two exposure processes and one development process on the photoresist material layer 302; similarly, the conductor patterns G2 located at the driver circuit regions DR1 and DR2 of the mother sheet 20 or traces in the peripheral circuit regions B1 and B2 of the mother sheet 20 may also be formed by performing two exposure processes and one development process on the photoresist material layer. The conductor patterns G1 and G2 depicted in FIG. 1B and FIG. 1C may be gates, respectively. To be more specific, in other embodiments, when the conductor patterns G1 are being formed, scan lines (not shown) may also be formed, and the conductor patterns G1 may be electrically connected to the scan lines; similarly, when the conductor patterns G2 are being formed, component connection wires (not shown) or active device connection wires (not shown) may also be formed, and the conductor patterns G2 may be electrically connected to the component connection wires or the active device connection wires.

Figure 3E:
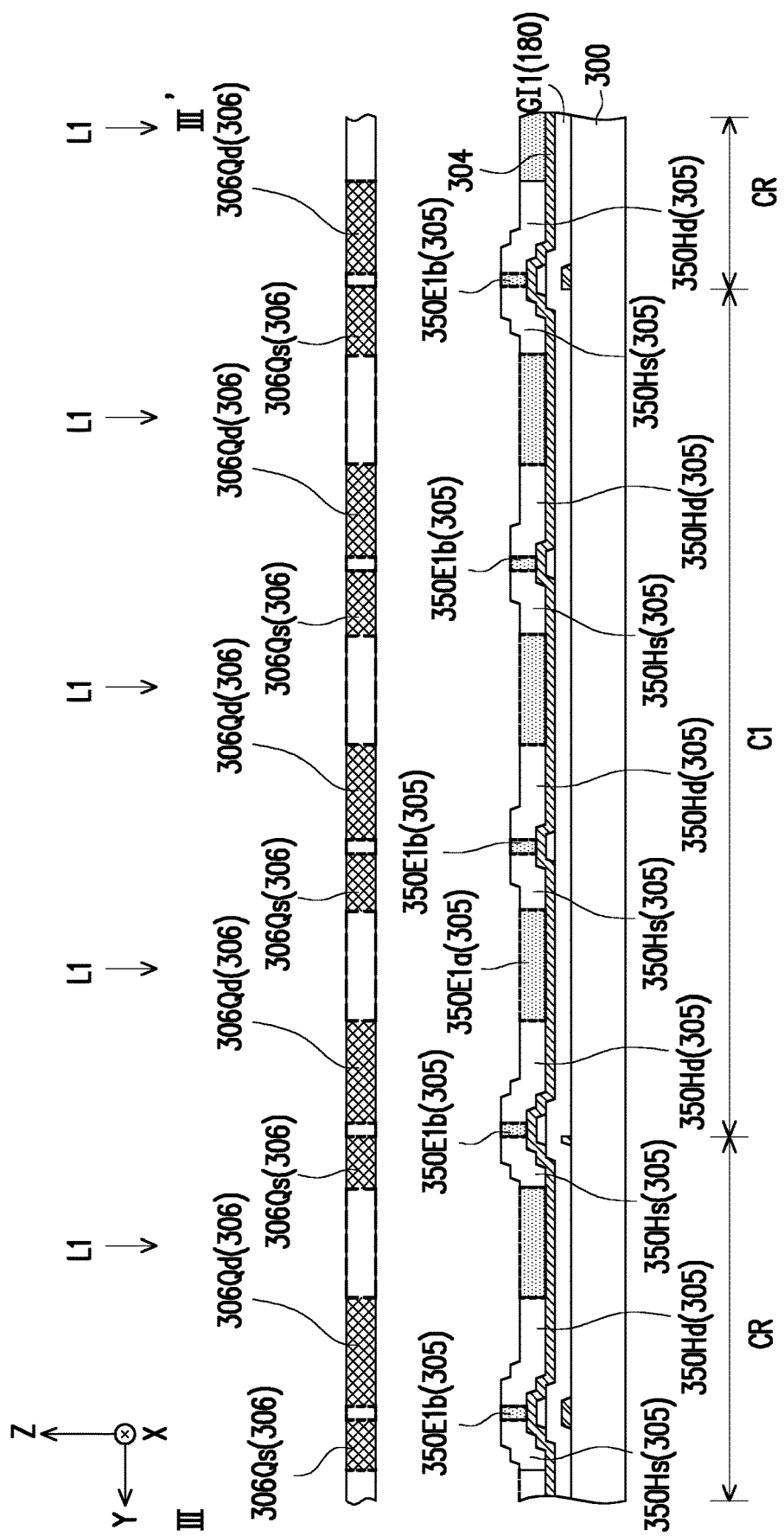

With reference to FIG. 3E, insulation blocks GI1 covering the conductor patterns G1 and the dummy conductor patterns WG1 are continuously formed above the substrate 100. In the embodiment, a material of the insulation blocks GI1 may include an inorganic material, an organic material, or a combination thereof; in some embodiments, when the insulation blocks GI1 are being formed at the central region CR of the mother sheet 20, insulation blocks GI2 may also be formed at the driver circuit regions DR1 and DR2 of the mother sheet 20. The insulation blocks GI1 and GI2 depicted in FIG. 1B and FIG. 1C may be gate insulation layers, respectively.

Semiconductor patterns SM1 overlapping the conductor patterns G1 or the dummy conductor patterns WG1 are then formed above the substrate 100. A material of the semiconductor patterns SM1 may include polysilicon. In the embodiment, the semiconductor patterns SM1 may be formed by performing one photolithography and etching process. In some embodiments, when the semiconductor patterns SM1 are being formed at the central region CR of the mother sheet 20, semiconductor patterns SM2 may also be formed at the driver circuit regions DR1 and DR2 of the mother sheet 20, and each of the semiconductor patterns SM1 and SM2 may respectively include a source region, a drain region, and a channel region. In the embodiment, the conductor patterns G1 and G2 are respectively disposed below the semiconductor patterns SM1 and SM2, so as to form bottom-gate thin film transistors (TFT). However, the disclosure is not limited thereto; in other embodiments, top-gate TFTs or TFTs of another appropriate type are also applicable.

A conductor material layer 304 is continuously formed on the substrate material layer 300. In consideration of conductivity, the conductor material layer 304 is normally made of a metallic material; in other words, the conductor material layer 304 and the conductor material layer 301 may be made of similar materials. A photoresist material layer 305 is then continuously formed on the entire conductive material layer 304, and the conductive material layer 304 and the photoresist material layer 305 are completely overlapped. After the photoresist material layer 305 is formed on the conductive material layer 304, another two exposure processes and one development process are performed. According to the present embodiment, in the first exposure process, the exposure beam L1 with the evenly distributed illuminance irradiates the photoresist material layer 305 through the first photomask 306, so as to form first non-exposure regions 305Hs and 305Hd and first exposure regions 305E1$a$ and 305E1$b$ on the photoresist material layer 305. Here, the first photomask 306 at least has opaque photoresist patterns 306Qs and 306Qd. In the embodiment, the shape of the projection of each first non-exposure region 305Hs on the substrate material layer 300 remains the same, and the shape of the projection of the first non-exposure regions 305Hs on the substrate material layer 300 is the same as the shape of the projection of the conductor patterns S1 on the substrate 100 as depicted in FIG. 1B; the shape of each first non-exposure region 305Hd remains the same, and the shape of the first non-exposure regions 305Hd is the same as the shape of the conductor patterns D1 depicted in FIG. 1B. In other words, according to the present embodiment, the first non-exposure regions 305Hs and 305Hd having the regular shape and arranged in an array are formed in the central region CR of the mother sheet 20; thereby, the mother sheet 20 may be cut to form the display panel of any size, and the size of the display panel is irrelevant to the pattern of the first photomask 306 (or the first exposure regions 305E1$a$ and 305E1$b$).

Figure 3F:
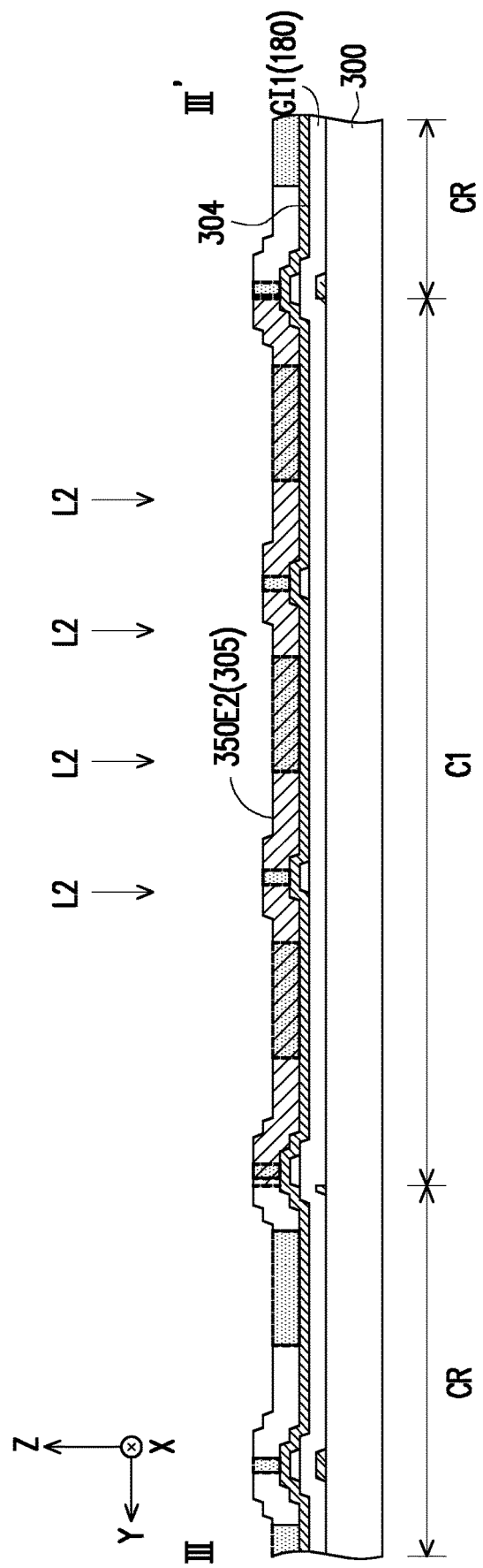

With reference to FIG. 3F, the second exposure process is performed to form a second exposure region 305E2 on the photoresist material layer 305. In the embodiment, the shape and the size of the second exposure regions 302E2 and 305E2 on the substrate material layer 300 are completely the same as those of the pre-cutting region C1. In some embodiments, the projection of the second exposure region 302E2 on the substrate material layer 300 and the projection of the second exposure region 305E2 on the substrate material layer 300 are completely overlapped; in other embodiments, in consideration of manufacturing precision, the projection of the second exposure region 302E2 on the substrate material layer 300 is not completely aligned to the projection of the second exposure region 305E2 on the substrate material layer 300. For instance, the projection of the second exposure region 302E2 on the substrate material layer 300 and the projection of the second exposure region 305E2 on the substrate material layer 300 are misaligned by 100 μm. Besides, In the embodiment, the second exposure region 302E2 may be partially or completely overlapped with a portion of the first non-exposure regions 305Hs and 305Hd and a portion of the first exposure regions 305E1*a* and 305E1*b*; in other embodiments, the second exposure region 302E2 is partially or completely overlapped with a portion of the first non-exposure regions 305Hs and 305Hd or a portion of the first exposure regions 305E1*a* and 305E1*b*. In other words, the mother sheet 20 may be cut to form the display panel of any size according to the shape of the second exposure region 305E2, and the size of the display panel is relevant to the pattern of the second exposure region 305E2 projected on the substrate material layer 300. In some embodiments, the exposure beam L2 provided by an exposure machine directly irradiates a portion of the photoresist material layer 305 in the second exposure process; that is, the exposure beam L2 has the focused illuminance distributed in the second exposure region 305E2 and thus no additional photomask is required. However, this should not be construed as a limitation in the disclosure; in other embodiments, the exposure beam L1 with the evenly distributed illuminance may be applied together with another second photomask (not shown) to generate the exposure beam L2 irradiating the photoresist material layer 305 in the second exposure process.

As shown in FIG. 3G, one development process is performed on the photoresist material layer 305 to form a patterned photoresist layer 305P. With reference to FIG. 3H, an etching process is performed on the conductor material layer 304 with use of the patterned photoresist layer 305P as a mask, and after the etching process is performed to form the conductor patterns S1 and D1 and the dummy conductor patterns WS1, the patterned photoresist layer 305P is removed. As such, the conductor material layer 304 may be patterned according to the first exposure regions 305E1*a* and 305E1*b* and the second exposure region 305E2 to form the dummy conductor patterns WS1 and the conductor patterns S1 and D1 as shown in FIG. 1B. Here, the shape of the projection of the conductor patterns S1 and D1 on the substrate material layer 300 is the same as the shape of the projection of the first non-exposure regions 305Hs and 305Hd on the substrate material layer 300, and the shape of the projection of the dummy conductor patterns WG1 and WS1 on the substrate material layer 300 is the same of the shape of the projection of the first non-exposure regions 305Hs and 305Hd excluding the shape of the projection of the second exposure region 305E2 on the substrate material layer 300; that is to say, the shape of the projection of a remaining region on the substrate material layer 300 after the second exposure region 305E2 is subtracted from the first non-exposure regions 305Hs and 305Hd. In the embodiment, the conductor patterns S1 and D1 located at the central region CR of the mother sheet 20 are formed by performing two exposure processes and one development process on the photoresist material layer 302; similarly, the conductor patterns S2 and D2 located at the driver circuit regions DR1 and DR2 of the mother sheet 20 may also be formed by performing two exposure processes and one development process on the photoresist material layer. The conductor patterns S1 and S2 depicted in FIG. 1B and FIG. 1C may be sources, respectively; the conductor patterns D1 and D2 may be drains, respectively. To be more specific, in other embodiments, when the conductor patterns S1 are being formed, data lines (not shown) may also be formed, and the conductor patterns S1 may be electrically connected to the data lines; similarly, when the conductor patterns S2 are being formed, component connection wires (not shown) or active device connection wires (not shown) may also be formed, and the conductor patterns S2 may be electrically connected to the component connection wires or the active device connection wires.

Figure 3I:
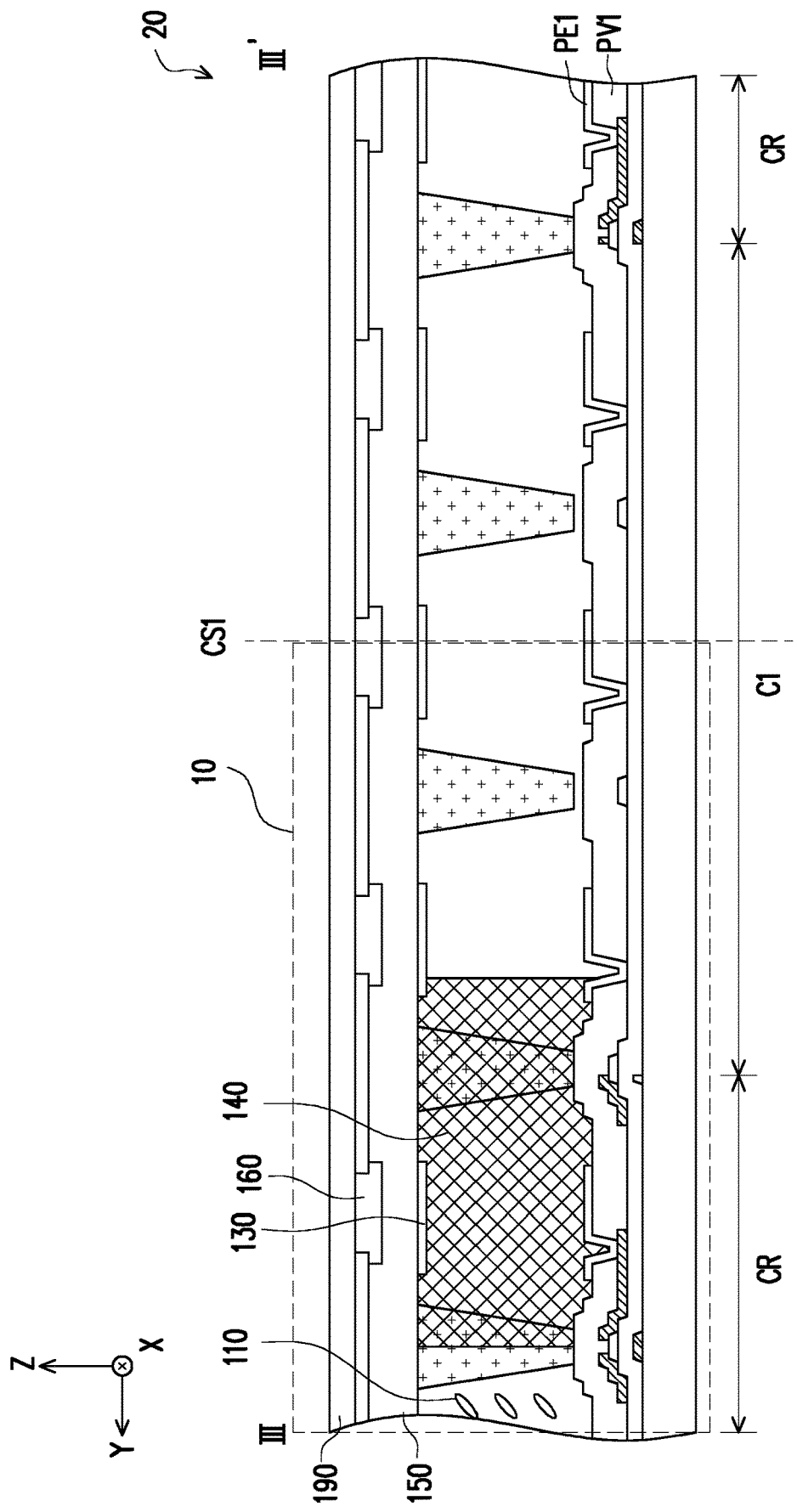

With reference to FIG. 3I, insulation blocks PV1 covering the conductor patterns S1 and D1 are formed above the substrate 100, so as to provide functions of protection or planarization. Besides, a photolithography and etching process is performed to expose a portion of the conductor patterns D1 from the insulation blocks PV1. In the embodiment, a material of the insulation blocks PV1 may include an inorganic material, an organic material, or a combination thereof.

A photolithography and etching process is then performed to form patterned pixel electrodes PE1 above the substrate 100. In the embodiment, the pixel electrodes PE1 cover the insulation blocks PV1 and fill the openings of the insulation blocks PV1 to be in contact with the conductor patterns D1. In the embodiment, a material of the pixel electrodes PE1 may include a transparent metal oxide conductor material including but not limited to: indium tin oxide (ITO), indium zinc oxide (IZO), aluminum tin oxide (ATO), aluminum zinc oxide (AZO), or indium germanium zinc oxide (IGZO). Here, the array substrate sheet of the mother sheet 20 may be completely formed.

After the opposite substrate sheet is completely formed, the array substrate sheet and the opposite substrate sheet may be assembled, and the display medium 110 may be sealed therebetween by the adhesion layer 140, so as to form the mother sheet 20 including a plurality of display panels (or a plurality of standard pixel units, a plurality of dummy pixel units, a plurality of standard stage circuits, and a plurality of dummy stage circuits). The opposite substrate sheet may include a substrate 190, a shield pattern layer 170, color filter patterns 160, a planarization layer 150, and a conductive layer 130. Each of the shield blocks 170S and 170D of the shield pattern layer 170 shields edges of the color filter patterns 160, the shield pattern layer 170 may be a black matrix (BM), and the color filter patterns 160 may be red, green, and blue color filter patterns, for instance. The conductive layer 130 may selectively be a transparent conductor material, e.g., ITO. The adhesion layer 140 may be a sealant, and the adhesion layer 140 and the cutting surface CS1 are not overlapped. Besides, a support structure 120, for example but not limited to a photo-spacer, may be selectively disposed between the array substrate sheet and the opposite substrate sheet, so as to form a cell gap. The location of the support structure 120 may correspond to the shield blocks 170S and 170D to prevent the reduction of aperture ratio.

In the embodiment, the display medium 110 may be a liquid crystal material, and the resultant display panel 10 is referred to as a liquid crystal display (LCD) panel, which should however not be construed as a limitation in the disclosure; in other embodiments, after proper adjustment is made, the display panel 10 may also be an electroluminescent material display panel or an active matrix organic light-emitting diode (AMOLED) display panel. Particularly, in the embodiment, the array substrate sheet is a substrate sheet with the TFTs, and the opposite substrate sheet is a color filter substrate sheet with the color filter patterns 160, which should however not be construed as limitations in the disclosure; in other embodiments, the array substrate sheet may also be a COA substrate sheet integrating the color filter patterns 160 onto the TFTs or an AOC substrate sheet integrating the TFTs on the color filter patterns 160, and in this case it is not necessary to form the color filter patterns 160 on the opposite substrate sheet. In other words, the conductor patterns G1, S1, and D1, the semiconductor patterns SM1, the pixel electrodes PE1, the color filter patterns 160, the shield blocks 170S, and the insulation blocks GI1 and PV1 are all disposed between the array substrate sheet and the opposite substrate sheet, i.e., disposed above one of the array substrate sheet and the opposite substrate sheet.

Figure 4:
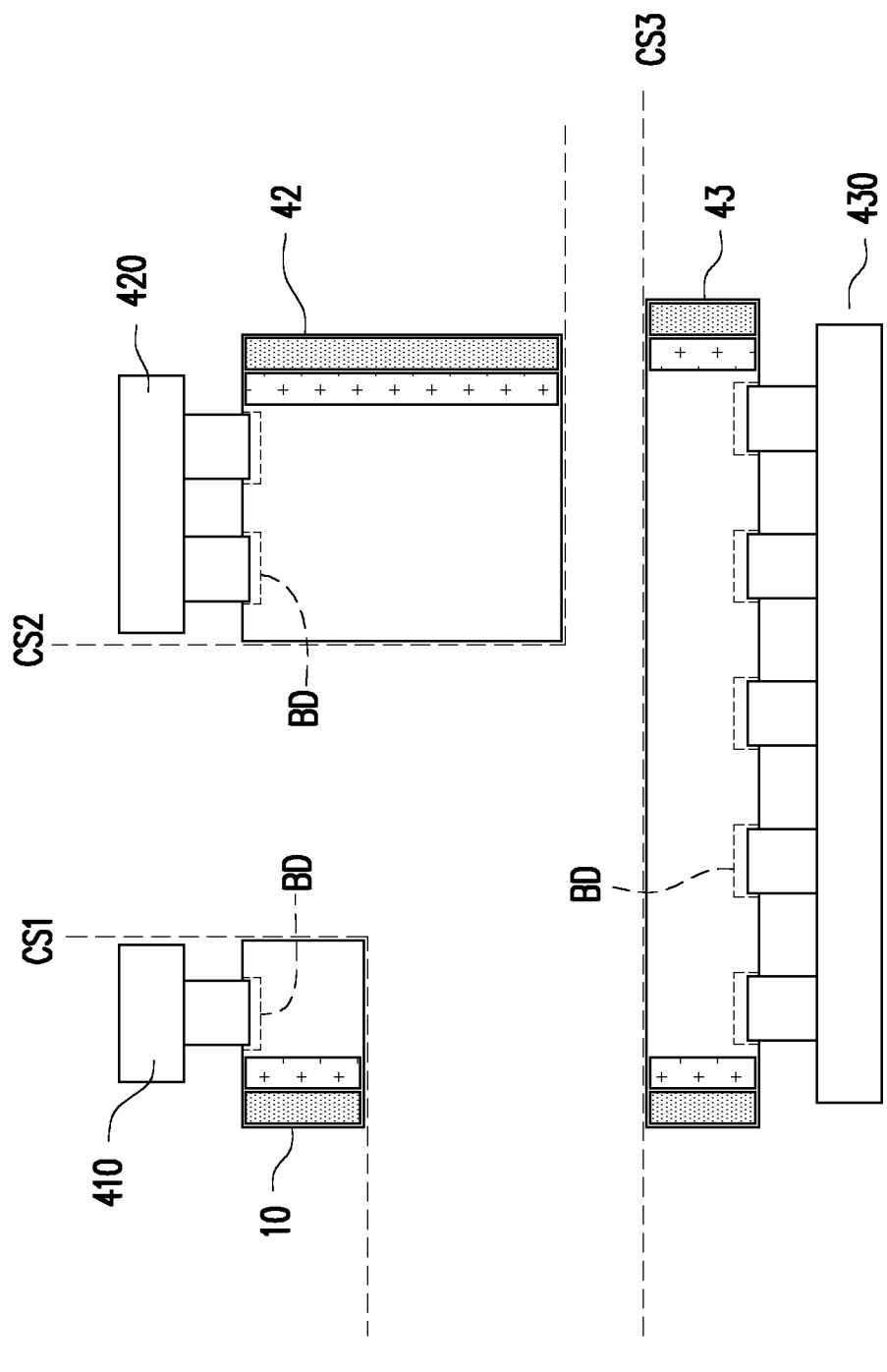
FIG. 4 is a schematic top view of a display panel cutting process of a mother sheet according to an embodiment of the disclosure.

With reference to FIG. 2, FIG. 3I, and FIG. 4, FIG. 4 is a schematic top view of a display panel cutting process of the display panel 10 of the mother sheet 20 according to an embodiment of the disclosure. After the mother sheet 20 is formed, the display panel cutting process is performed on the mother sheet 20 along the cutting surfaces CS1-CS3 through applying a mechanical method using cutting wheels or applying a laser cutting method, so as to form a plurality of independent display panels, e.g., the display panels 10, 42, and 43. The cutting surface CS1-CS3 depicted in FIG. 4 may be located in the second exposure region 302E2 or 305E2 depicted in FIG. 3B or FIG. 3F. Preferably, the cutting surfaces CS1-CS3 depicted in FIG. 4 may be located in a region where the second exposure regions 302E2 and 305E2 depicted in FIG. 3B and FIG. 3F are overlapped. It may be derived from the above that the dummy pixel units DPC or the dummy stage circuits DSC are disposed at the pre-cutting regions C1-C3 of the mother sheet 20; therefore, it is the dummy pixel units DPC or the dummy stage circuit DSC that are distributed on portions of the resultant display panels 10, 42, and 43 near the cutting surfaces CS1-CS3, and there is no metal or conductor materials exposed along the cutting surfaces CS1-CS3. As such, the quality of the resultant display panels 10, 42, and 43 does not deteriorate due to metal corrosion in the subsequent testing and delivery processes, and the high temperature and moisture will not lead to metal corrosion nor the issue of short circuit of the display panel cutting process. Additionally, the pre-cutting regions C1-C3 of the mother sheet 20 may be further adjusted in consideration of different design and system requirements, and therefore the size of the display panel 10 obtained by cutting the mother sheet 20 may be flexibly adjusted. After the display panel cutting process is performed, the edges of the dummy pixel units DPC and the dummy stage circuit DSC of the display panels 10, 42, and 43 next to the cutting surfaces CS1-CS3 are aligned to the cutting surfaces CS1-CS3. The display panels 10, 42, and 43 may be respectively bonded to external circuits 410, 420, and 430 through the bonding region BD; here, the external circuits 410, 420, and 430 are control circuits or driver chips, for instance.

The display panel 10 and the mother sheet 20 may be properly adjusted in consideration of different design requirements. In FIG. 1B, the difference between the standard pixel units SPC and the dummy pixel units DPC lies in that each of the dummy pixel units DPC does not include the conductor patterns G1, D1, and S1 of (one of) the standard pixel units SPC, so as to prevent short circuit of the display panel cutting process or prevent corrosion after the display panel cutting process. However, this should not be construed as limitations in the disclosure; when the location of the cutting surface CS1 in the pre-cutting region C1 is deviated, it is likely for all of the dummy pixel units DPC not to include the conductor patterns G1, D1, and S1 and the dummy conductor patterns WG1 and WS1. In another aspect, there may be other differences in components between the dummy pixel units DPC and the standard pixel units SPC. In some embodiments, each of the dummy pixel units does not include the pixel electrodes PE1 of (one of) the standard pixel units SPC; in some embodiments, each of the dummy pixel units does not include the semiconductor patterns SM1 of (one of) the standard pixel units SPC; in some embodiments, each of the dummy pixel units does not include the insulation blocks GI1 or the insulation blocks PV1 of (one of) the standard pixel units SPC. Similarly, there may be other differences in components between the dummy stage circuits DSC and the standard stage circuits SSC.

Figure 5:
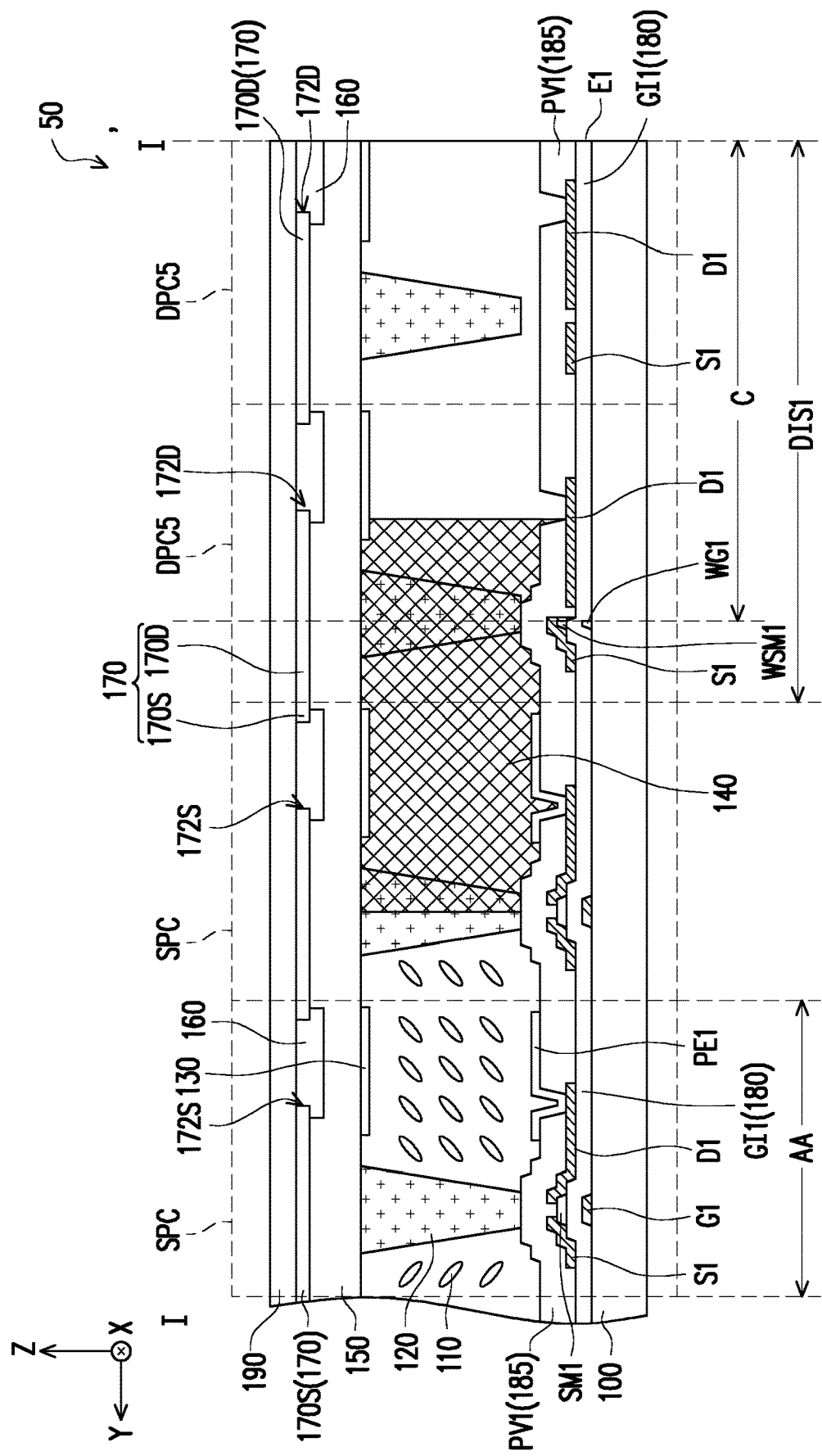
FIG. 5 to FIG. 7 are schematic cross-sectional views of a display panel according to an embodiment of the disclosure.

For instance, with reference to FIG. 5, FIG. 5 is a schematic cross-sectional view of a display panel 50 according to an embodiment of the disclosure, and the cross-sectional location shown in FIG. 5 corresponds to the location of the sectional line I-I' depicted in FIG. 1A. The display panel 50 provided in the embodiment and the display panel 10 provided in the embodiment depicted in FIG. 1B are structurally similar but different because none of the dummy pixel units DPC5 of the display panel 50 include the conductor patterns G1, the pixel electrodes PE1, and semiconductor patterns SM1 of the standard pixel units SPC. Thereby, the high temperature and moisture will not lead to the issue of short circuit of the display panel cutting process. The pixel electrodes PE1 and the openings 172S of the shield blocks 170S (and the color filter patterns 160) are overlapped, respectively; none of the pixel electrodes PE1 are overlapped with the openings 172D of the shield blocks 170D (and the color filter patterns 160). Besides, the semiconductor patterns SM1 and the shield blocks 170S (or the color filter patterns 160) are overlapped, respectively; none of the semiconductor patterns SM1 are overlapped with the shield blocks 170D (or the color filter patterns 160). Under said circumstances, the manufacturing method of the pixel electrodes PE1 and the semiconductor patterns SM1 may be similar to the manufacturing method of the conductor patterns G1, G2, S1, S2, D1, and D2 depicted in FIG. 3A to FIG. 3H, and dummy semiconductor patterns WSM1 (or dummy pixel electrodes) are formed by performing two exposure processes and one development process on the photoresist material layer. In addition, as shown in FIG. 5, the edge of the dummy pixel units DPC5 near the edge (e.g., the edge E1) of the substrate 100e is aligned to the edge (e.g., the edge E1) of the substrate 100.

Figure 6:
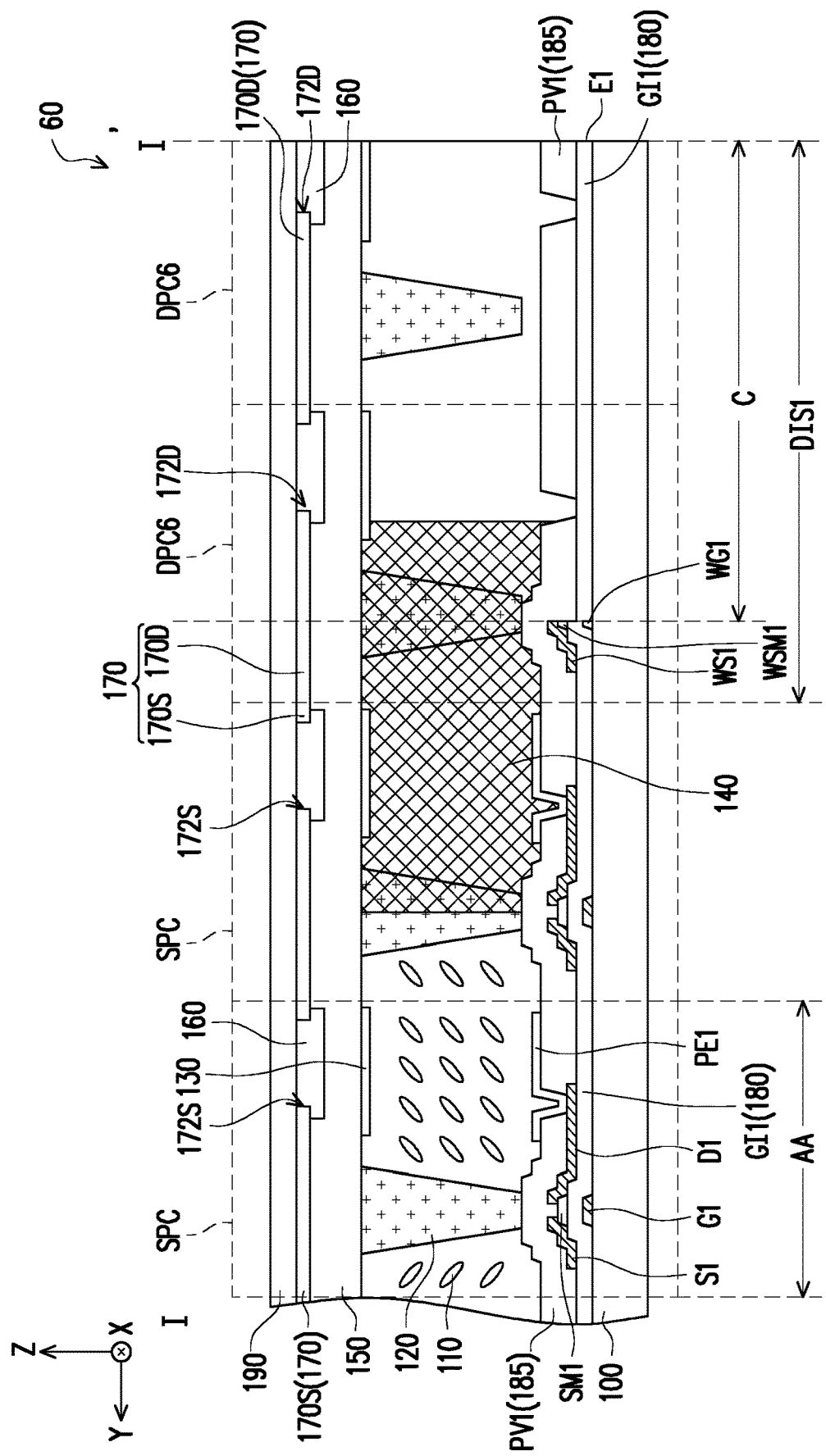

Similarly, with reference to FIG. 6, FIG. 6 is a schematic cross-sectional view of a display panel 60 according to an embodiment of the disclosure, and the cross-sectional location shown in FIG. 6 corresponds to the location of the sectional line I-I' depicted in FIG. 1A. The display panel 60 provided in the embodiment and the display panel 10 provided in the embodiment depicted in FIG. 1B are structurally similar but different because none of the dummy pixel units DPC6 of the display panel 60 include the conductor patterns G1, D1, and S1, the pixel electrodes PE1, and semiconductor patterns SM1 of the standard pixel units SPC. Thereby, the high temperature and moisture will not lead to the issue of short circuit of the display panel cutting process. In addition, as shown in FIG. 6, the edge of the dummy pixel units DPC6 near the edge (e.g., the edge E1) of the substrate 100e is aligned to the edge (e.g., the edge E1) of the substrate 100.

Figure 7:
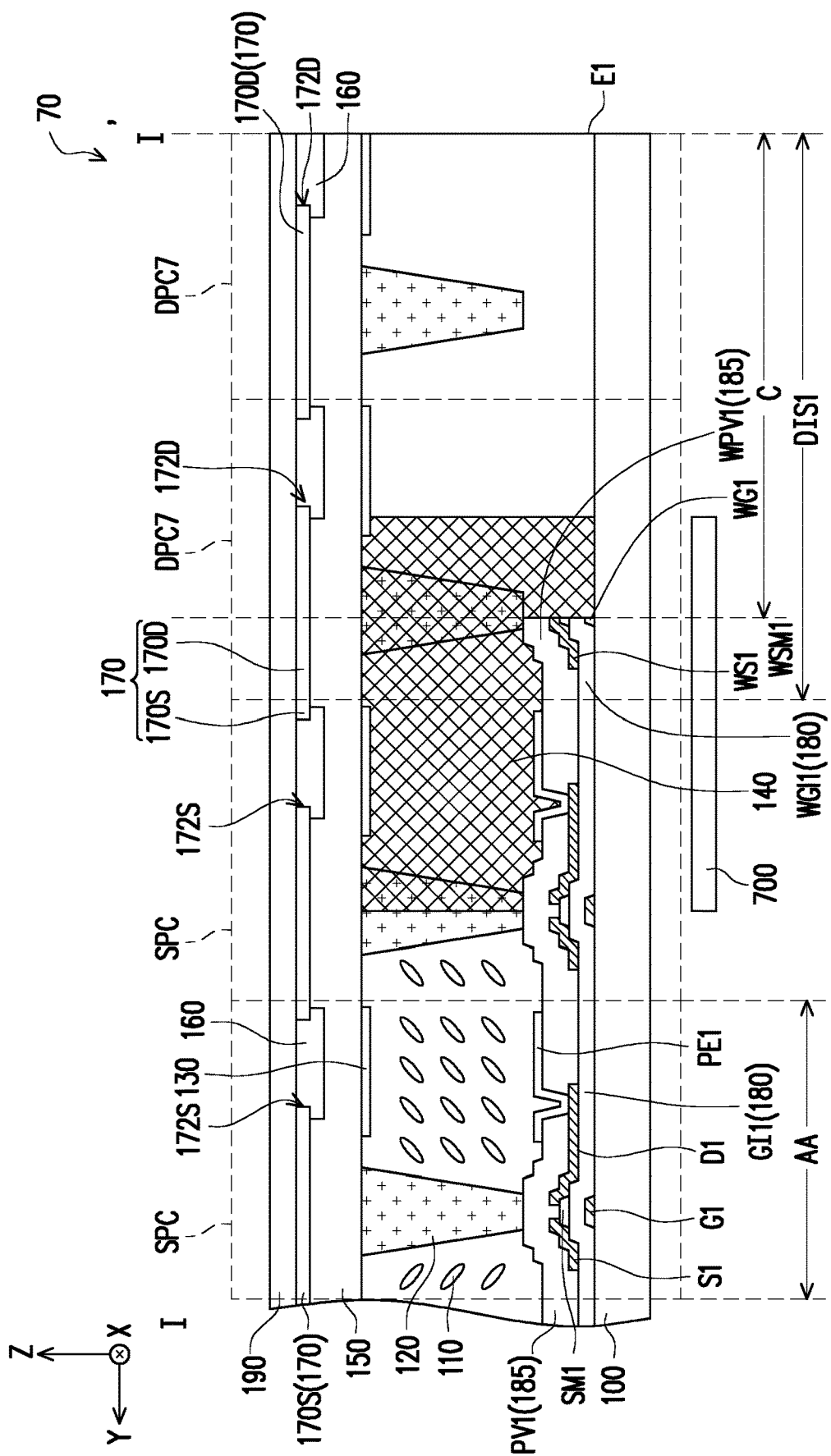

Similarly, with reference to FIG. 7, FIG. 7 is a schematic cross-sectional view of a display panel 70 according to an embodiment of the disclosure, and the cross-sectional location shown in FIG. 7 corresponds to the location of the sectional line I-I' depicted in FIG. 1A. The display panel 70 provided in the embodiment and the display panel 10 provided in the embodiment depicted in FIG. 1B are structurally similar but different because none of the dummy pixel units DPC7 of the display panel 70 include the conductor patterns G1, D1, and S1, the pixel electrodes PE1, the semiconductor patterns SM1, and the insulation blocks GI1 and PV1 of the standard pixel units SPC. Thereby, the high temperature and moisture will not lead to the issue of short circuit of the display panel cutting process. Under said circumstances, the manufacturing method of the insulation blocks GI1 and PV1 may be similar to the manufacturing method of the conductor patterns G1, G2, S1, S2, D1, and D2 depicted in FIG. 3A to FIG. 3H, and dummy insulation blocks WGI1 and WPV1 are formed by performing two exposure processes and one development process on the photoresist material layer. Besides, the shield blocks 170S (or the openings 172S thereof) and the insulation blocks GI1 and PV1 are overlapped, respectively, and none of the shield blocks 170D (or the openings 172D thereof) and the insulation blocks GI1 and PV1 are overlapped. In addition, as shown in FIG. 7, the edge of the dummy pixel units DPC7 near the edge (e.g., the edge E1) of the substrate 100e is aligned to the edge (e.g., the edge E1) of the substrate 100. In some embodiments, the display panel 70 may further include a light shielding adhesion bar 700 configured to prevent light leakage on the edge and arranged at the non-display region NAA, and the light shielding adhesion bar 700 may be overlapped with a portion of the standard pixel units SPC or a portion of the dummy pixel units DPC7 (or a portion of the standard stage circuits SSC or a portion of the dummy stage circuits DSC).

Figure 8A:
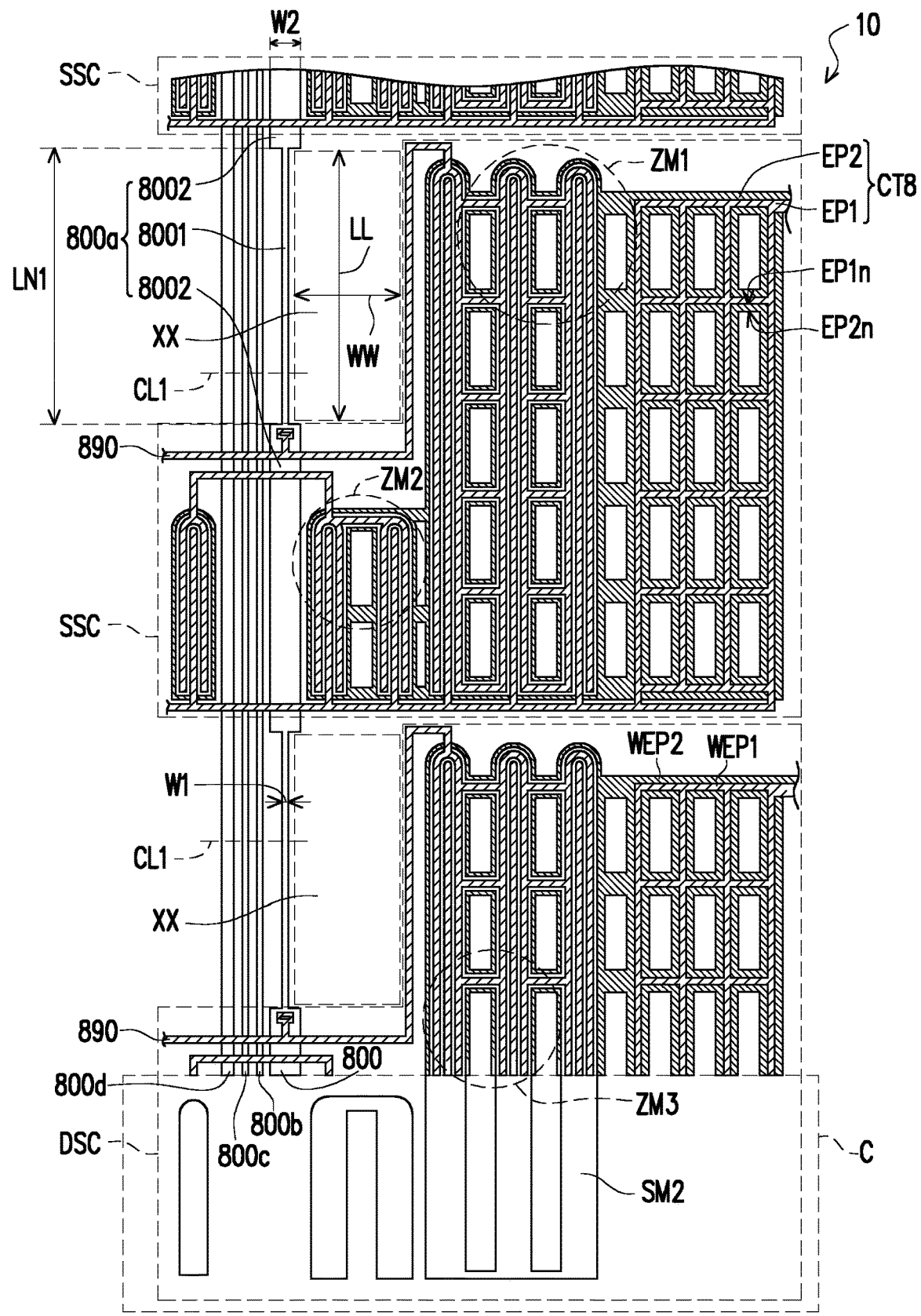
FIG. 8A is a schematic top view of a portion of the display panel 10 depicted in FIG. 1A.
Figure 8B:
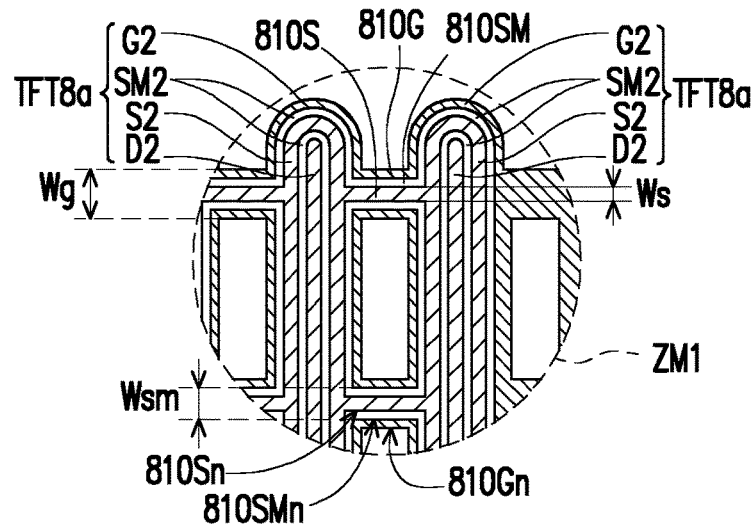
FIG. 8B to FIG. 8D are schematic top views of partial regions of the display panel depicted in FIG. 8A.
Figure 8C:
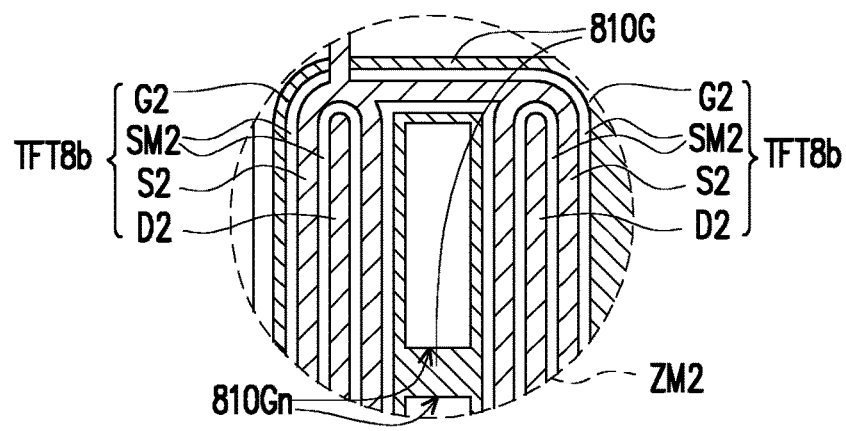
Figure 8D:
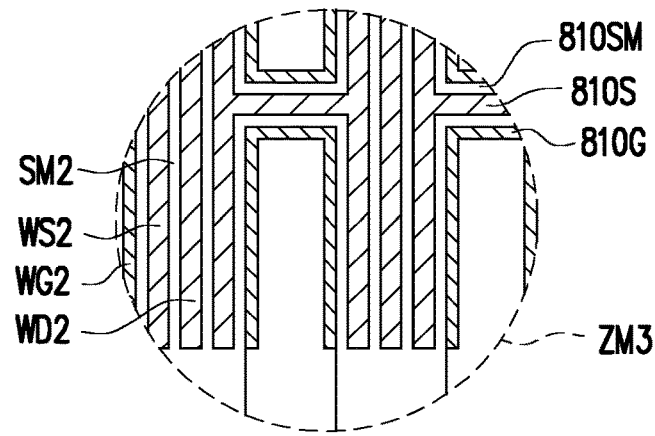

The driver circuit region DR of the display panel 10 may be further adjusted to reduce signal interference. With reference to FIG. 1A, FIG. 1C, and FIG. 8A to FIG. 8D, FIG. 8A is a schematic top view of a portion of the display panel 10 depicted in FIG. 1A; FIG. 8B to FIG. 8D are schematic top views of partial regions ZM1-ZM3 of the display panel 10 depicted in FIG. 8A. For clear illustration, some layers or components in FIG. 1A and FIG. 1C are omitted in FIG. 8A to FIG. 8D, and relative sizes, thicknesses, and locations of the layers, regions, and/or structures in FIG. 8A to FIG. 8D may be adaptively increased or decreased. As shown in FIG. 8A to FIG. 8C, in the embodiment, each of the standard stage circuits SSC includes active devices TFT8a and TFT8b, active device connection wires 810S, 810G, and 810SM, a capacitor CT8, and component connection wires 890. The active devices TFT8a and TFT8b respectively include conductor patterns G2, S2, and D2 and semiconductor patterns SM2; the capacitor CT8 includes electrode plates EP1 and EP2. As shown in FIG. 8A and FIG. 8D, the dummy stage circuit DSC (or each dummy stage circuit DSC) includes dummy conductor patterns WG2, WS2, and WD2, semiconductor patterns SM2, dummy electrode plates WEP1 and WEP2, the active device connection wires 810S, 810G, and 810SM, and the component connection wires 890. It may be learned again that the difference between the standard pixel units SPC and the dummy pixel units DPC lies in that the components therein are not completely the same.

Specifically, after the mother sheet 20 is cut to form the display panel 10, the dummy conductor patterns WG2, WS2, and WD2 of the dummy stage circuit DSC may be coupled to the standard stage circuits SSC through a stage connection wire 800a, 800b, 800c, or 800d, which may lead to signal interference. To prevent signal interference, after the mother sheet 20 is cut to form the display panel 10, the stage connection wires 800a-800d should be further cut off along a cutting line CL1, e.g., laser may be applied to cut the driver circuit along the cutting line CL1. In other embodiments, it is also likely to cut the driver circuit before the display panel cutting process of the display panel 10 is performed. As shown in FIG. 8A, in the embodiment, the stage connection wire 800a, 800b, 800c, or 800d may be electrically connected between the standard stage circuits SSC adjacent to each other. Alternatively, the stage connection wire 800a, 800b, 800c, or 800d may be electrically connected between the standard stage circuit SSC and the dummy stage circuit DSC adjacent to the standard stage circuit SSC. However, this should however not be construed as a limitation in the disclosure. In other embodiments, the stage connection wire 800a, 800b, 800c, or 800d may be electrically connected between the non-adjacent standard stage circuits SSC. Alternatively, the stage connection wire 800a, 800b, 800c, or 800d may be electrically connected between the standard stage circuit SSC and dummy stage circuit DSC which are not adjacent to each other. In other embodiments, the stage connection wire 800a, 800b, 800c, or 800d may be electrically connected between two standard stage circuits SSC or between one standard stage circuit SSC and one dummy stage circuit DSC; in other embodiments, the stage connection wire 800a, 800b, 800c, or 800d may electrically connect the standard stage circuits SSC or the dummy stage circuits DSC to other circuits.

The stage connection wire 800a is on the outermost side (as compared to other adjacent stage connection wires 800b, 800c, and 800d); namely, the stage connection wire 800a is outer and further from other adjacent stage connection wires 800b, 800c, and 800d and/or located on the edge compared to other stage connection wires 800b, 800c, and 800d adjacent to the stage connection wire 800a). In consideration of manufacturing precision, according to some embodiments, the stage connection wire 800a on the outermost side should have a pre-cut segment that is adjacent to the cutting line CL1, and the pre-cut segment should be arranged away from other components. In other words, a clearance region XX should be arranged for performing the driver circuit cutting process of the stage connection wires 800a-800d. Specifically, as shown in FIG. 8A, the stage connection wire 800a on the outermost side may have a first segment 8001 and a second segment 8002, wherein the first segment 8001 is the pre-cut segment adjacent to the cutting line CL1, and the first segment 8001 is arranged adjacent to the clearance region XX. Besides, the first segment 8001 may be aligned to the clearance region XX; particularly, the upper edge, the edge on the right-hand side, and the lower edge of the first segment 8001 may be aligned to the upper edge, the edge on the left-hand side, and the lower edge of the clearance region XX. In some embodiments, the stage connection wire 800a may be configured to provide a direct current at certain level, which should however not be construed as a limitation in the disclosure. To ensure that the first segment 8001 is arranged away from other components, the active devices TFT8a and TFT8b, the component connection wires 890, the capacitor CT8, or the active device connection wires 810S, 810G, and 810SM all vacate or are absent from the clearance region XX. In other words, the clearance region XX does not have the active devices TFT8a and TFT8b, the component connection wires 890, the capacitor CT8, the active device connection wires 810S, 810G, and 810SM, or any other component transmitting signals. In some embodiments, the length LL of the clearance region XX is within a range from 50 μm to 150 μm, and the width WW of the clearance region XX is within a range from 50 μm to 150 μm. The clearance region XX may be located between the adjacent standard stage circuit SSC and dummy stage circuit DSC (i.e., between the standard stage circuit SSC and dummy stage circuit DSC adjacent to each other), and the first segment

8001 of the stage connection wire 800*a* on the outermost side is disposed adjacent to the clearance region XX. Therefore, when the stage connection wires 800*a*-800*d* are cut off along the cutting line CL1, the arrangement of the clearance region XX may prevent components other than the stage connection wires 800*a*-800*d* from being damaged, and thus the yield of the driver circuit cutting process performed on the stage connection wires 800*a*-800*d* may be improved. In some embodiments, note that less important components (e.g., floating components) may be disposed in the clearance region XX. Besides, as shown in FIG. 8A, the cutting line CL1 is disposed adjacent to the clearance region XX located between the adjacent standard stage circuit SSC and dummy stage circuit DSC or between two adjacent standard stage circuits SSC.

To further improve the yield of the driver circuit cutting process, the width of any of the stage connection wires 800*a*-800*d* may be further adjusted. For instance, as shown in FIG. 8A, the line width W1 of the first segment 8001 of the stage connection wire 800*a* is smaller than the line width W2 of the second segment 8002. In some embodiments, the line width W1 of the first segment 8001 is substantially within a range from 8 μm to 10 μm, and the line width W2 of the second segment 8002 is substantially within a range from 100 μm to 200 μm. In some embodiments, a ratio of the line width W1 of the first segment 8001 to the line width W2 of the second segment 8002 ranges from 0.04 to 1. In some embodiments, the length LN1 of the first segment 8001 is within a range from 50 μm to 150 μm. In other embodiments, the stage connection wires 800*b*-800*d* may have a plurality of segments having different widths, so as to easily perform the driver circuit cutting process on the stage connection wires 800*a*-800*d*.

Additionally, as shown in FIG. 1C and FIG. 8A, the adhesion layer 140 may be overlapped with a portion of the standard stage circuits SSC or a portion of the dummy stage circuits DSC; therefore, the components of the standard stage circuits SSC and the dummy stage circuit DSC may be further adjusted to guarantee the curing of the adhesion layer 140. For instance, the electrode plate EP1 of the capacitor CT8 has a plurality of openings EP1*n*, the electrode plate EP2 of the capacitor CT8 also has a plurality of openings EP2*n*, and the openings EP1*n* and the openings EP2*n* are overlapped respectively. In other words, the capacitor CT8 has a hollow structure capable of increasing transmittance of the capacitor CT8, so as to guarantee the curing of the adhesion layer 140. Similarly, the dummy electrode plates WEP1 and WEP2 of the dummy stage circuit DSC respectively have a plurality of openings, so as to form the hollow structure. Note that the number of the openings EP1*n* and EP2*n* in FIG. 8A is 15, respectively, which should however not be construed as a limitation in the disclosure; the number of the openings EP1*n* and EP2*n* may be adaptively adjusted in response to different requirements.

In another aspect, according to some embodiments, the active devices TFT8*a* may be electrically connected through the active device connection wires 810S, 810G, or 810SM. Here, the active device connection wires 810S and the conductor patterns S2 of the active devices TFT8*a* may define a plurality of openings 810Sn, the active device connection wires 810G and the conductor patterns G2 of the active devices TFT8*a* may define a plurality of openings 810Gn, and the active device connection wires 810SM and the semiconductor patterns SM2 of the active devices TFT8*a* may define a plurality of openings 810SMn. In other embodiments, the active device connection wires 810S, 810G, and 810SM allow the two adjacent active device TFT8*a* to be connected in parallel. In other embodiments, the line widths Ws, Wg, and Wsm of the active device connection wires 810S, 810G, and 810SM are less than 40 μm, respectively. Similarly, the active devices TFT8*b* may be electrically connected through the active device connection wires 810G, so as to form openings 810Gn. In other words, the active devices TFT8*a* and TFT8*b* and the active device connection wires 810S, 810G, or 810SM may constitute a hollow structure, thus increasing the transmittance of the active devices TFT8*a* and TFT8*b* to guarantee the curing of the adhesion layer 140. Note that the number of the openings 810Sn, 810Gn, and 810SMn may also be adaptively adjusted in response to different requirements. Besides, (more than one of) the active device connection wires 810G arranged among the active devices TFT8*a* may divide the current, so as to increase the equivalent line width and the current tolerance and prevent one single active device connection wire 810G from being damaged by overly high load current; similarly, the number of the active device connection wires 810S or 810SM arranged among the active devices TFT8*a* is more than one. In some embodiments, the active devices TFT8*a* and TFT8*b* may be two-finger transistors; in other embodiments, the active devices TFT8*a* and TFT8*b* may be multi-finger transistors. Additionally, as shown in FIG. 1C and FIG. 8A to FIG. 8C, the edge of the conductor patterns S2 of the active devices TFT8*a* and TFT8*b* and the edge of the semiconductor patterns SM2 may be offset; however, in other embodiments, the edge of the conductor patterns S2 of the active devices TFT8*a* and TFT8*b* and the edge of the semiconductor patterns SM2 may be aligned, so as to reduce the load capacitance between the gates and the sources of the active devices TFT8*a* and TFT8*b* and the load capacitance between the gates and the drains of the active devices TFT8*a* and TFT8*b*. Similarly, the dummy conductor patterns WG2 and WS2 and the semiconductor patterns SM2 of the dummy stage circuits DSC and the active device connection wires 810S, 810G, or 810SM may also constitute a hollow structure.

To easily perform the driver circuit cutting process, the display panel may be further adjusted. Please refer to FIG. 9, which is a schematic top view of a portion of a display panel 90 according to an embodiment of the disclosure. The display panel 90 provided in the embodiment and the display panel 10 provided in the embodiment depicted in FIG. 8A are structurally similar but different because of the arrangement of the clearance region XX. Different from the display panel 10, the adjacent standard stage circuits SSC9 of the display panel 90 may be spaced from each other by a cell gap, and the clearance region XX is also disposed. Alternatively, the adjacent standard stage circuit SSC9 and dummy stage circuit DSC9 may be spaced from each other by a cell gap, and the clearance region XX is located in the cell gap. The active devices TFT9*a* and TFT8*b*, the active device connection lines 810S, 810G, and 810SM, the capacitor CT9, and the component connection wires 990 of the standard stage circuits SSC9 are absent from or all vacate the clearance region XX; similarly, the dummy conductor patterns WG9, WS9, and WD9, the semiconductor patterns SM9, the dummy electrode plates WEP3 and WEP4, the active device connection wires 810S, 810G, and 810SM, and the component connection wires 990 of the dummy stage circuits DSC9 are absent from or all vacate the clearance region XX. In other words, the cell gaps substantially expand the clearance region XX, so as to further improve the yield of the driver circuit cutting process. In addition, to reduce the resistance, the width of the stage connection wires 800*a*-800*d* may be of a fixed value and remain unchanged in the embodiment.

Figure 9:
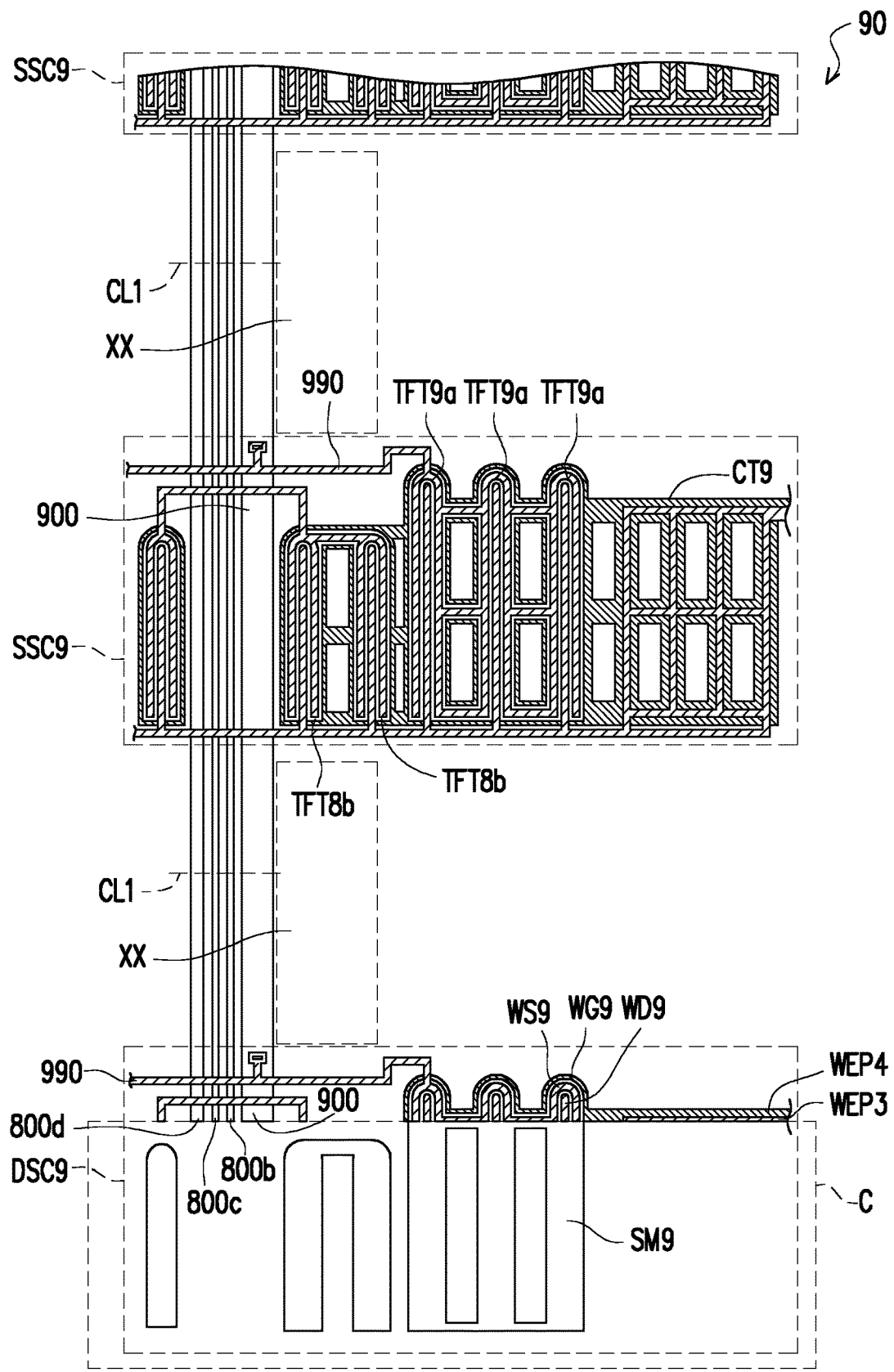
FIG. 9 to FIG. 11 are schematic top views of a portion of a display panel according to an embodiment of the disclosure.
Figure 10:
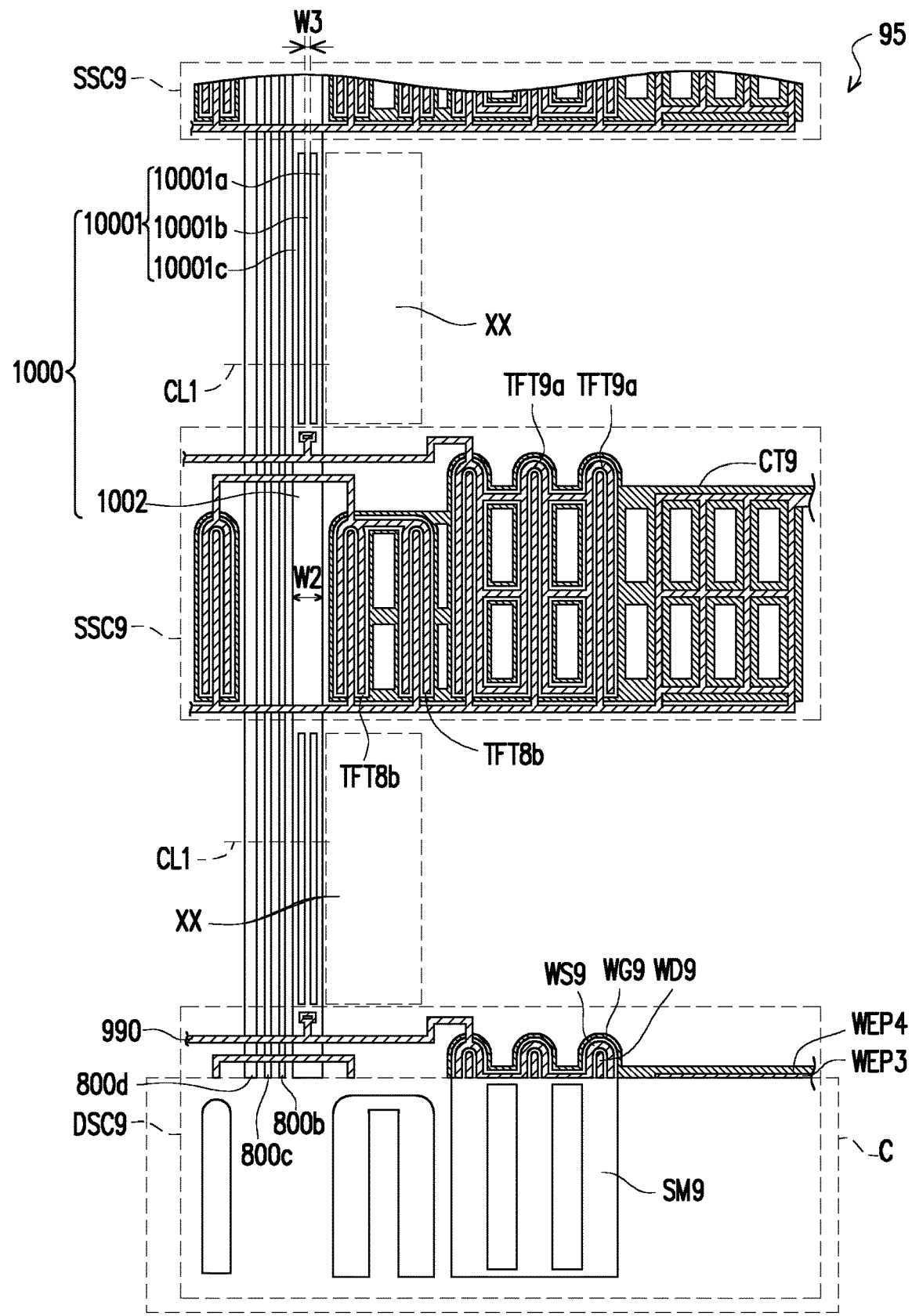

To easily perform the driver circuit cutting process, the display panel may be further adjusted. Please refer to FIG. 10, which is a schematic top view of a portion of a display panel 95 according to an embodiment of the disclosure. The display panel 95 provided in the embodiment and the display panel 90 provided in the embodiment depicted in FIG. 9 are structurally similar but different because the structure of the stage connection wires may be further adjusted. For instance, as shown in FIG. 10, the stage connection wire 1000 has a first segment 10001 and a second segment 10002, the first segment 10001 of the stage connection wire 1000 has branches 10001*a*-10001*c*, and the line width W3 of the branches 10001*a*-10001*c* is smaller than the line width W2 of the second segment 10002. In some embodiments, the line width W3 of the branches 10001*a*-10001*c* is substantially within a range from 8 µm to 10 µm. In other embodiments, the stage connection wires 800*b*-800*d* may also have a plurality of branches for easily performing the driver circuit cutting process. Note that the number of the branches 10001*a*-10001*c* of the first segment 10001 in FIG. 10 is 3, which should however not be construed as a limitation in the disclosure; the number of the branches of the first segment 10001 may be adaptively adjusted in response to different requirements.

Figure 11:
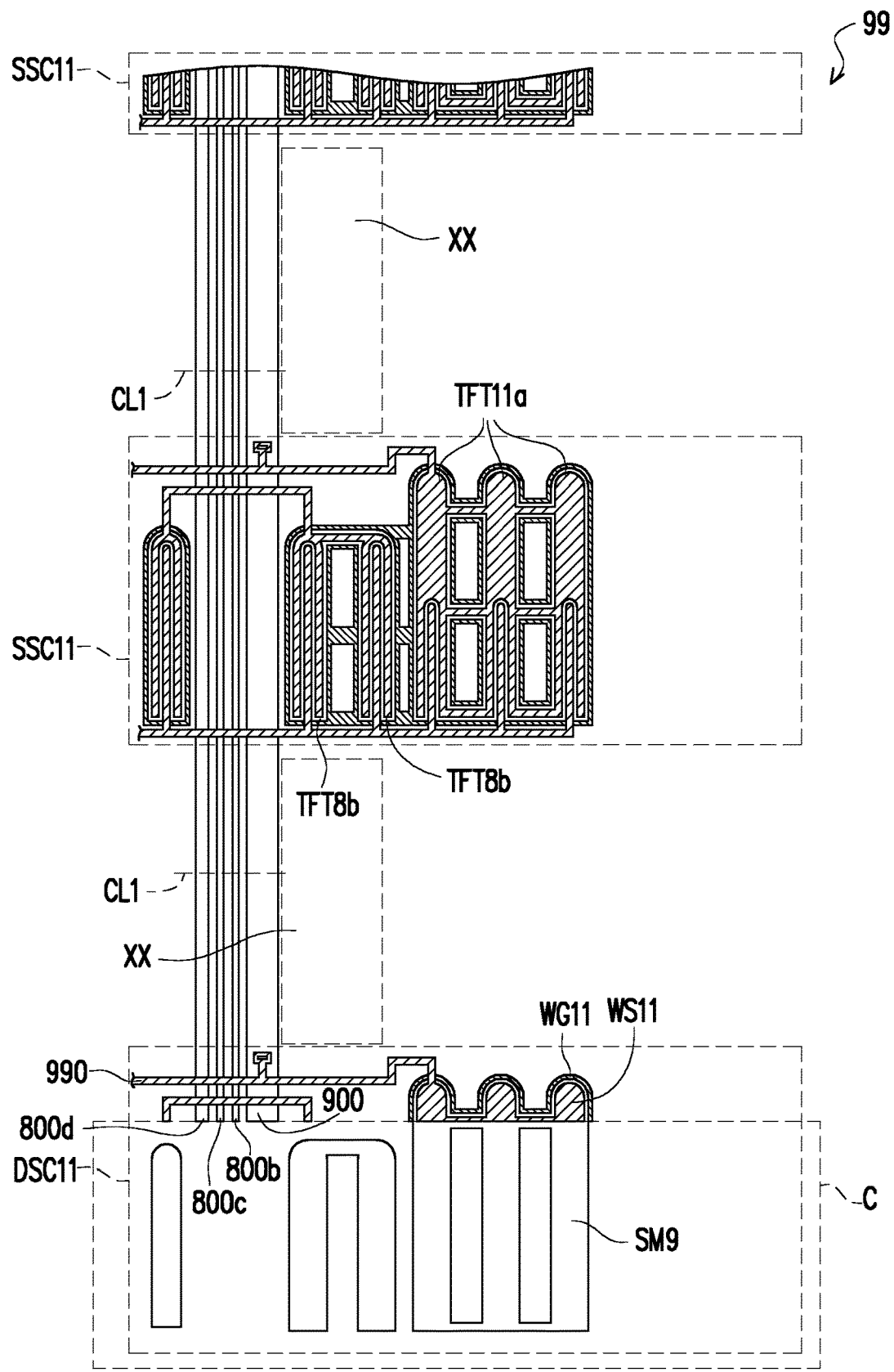

To easily perform the driver circuit cutting process, the display panel may be further adjusted. Please refer to FIG. 11, which is a schematic top view of a portion of a display panel 99 according to an embodiment of the disclosure. The display panel 99 provided in the present embodiment and the display panel 90 provided in the embodiment depicted in FIG. 9 are structurally similar and may perform similar functions as well as achieve similar effects, and thus the same reference numbers or symbols in FIG. 11 and FIG. 9 refer to the same components. The difference between the present embodiment and the embodiment depicted in FIG. 9 lies in that the components of the standard stage circuits SSC11 and the dummy stage circuits DSC11 of the display panel 99 may be further adjusted. Specifically, it is likely for (each of) the standard stage circuits SSC11 not to include the capacitor CT8; likewise, it is likely for (each of) the dummy stage circuits DSC11 not to include the dummy electrode plates WEP1 and WEP2. Besides, the shape of the active devices TFT11*a* of the standard stage circuits SSC11 is different from the shape of the active devices TFT9*a* of the standard stage circuits SSC9 in FIG. 9; in this case, the active devices TFT11*a* may achieve capacitance effects. Similarly, the shape of the dummy conductor patterns WG11 and WS11 of the dummy stage circuits DSC11 is different from the shape of the dummy conductor patterns WG9 and WS9 of the dummy stage circuits DSC9 in FIG. 9.

To sum up, the mother sheet provided herein may be cut to form the display panel of any size. In order to prevent the layers or the components in the display region from being damaged in the display panel cutting process, the pre-cutting region is reserved on the edge of the display panel. There are merely the dummy pixel units or the dummy stage circuits lacking specific materials (e.g., the conductor materials) disposed in the pre-cutting region; therefore, after the display panel cutting process is performed, there is no exposed conductor material on the edge of the resultant display panel, so as to prevent the issue of short circuit of different layers or components in the process of cutting the display panel and the issue of corrosion of the conductor materials after the process of cutting the display panel is performed. As such, good display quality may be guaranteed.

Additionally, to prevent signal interference resulting from the dummy stage circuits, the driver circuit cutting process is performed after the display panel cutting process, so as to cut off the stage connection wires. The stage connection wires have the segments with different widths, or the pre-cutting segments of the stage connection wires may be arranged away from other components, so as to improve the yield of the driver circuit cutting process. Moreover, the adhesion layer may be disposed at any location in response to the customization of the display panel, so that the adhesion layer may be overlapped with a portion of the standard stage circuits or a portion of the dummy stage circuits. As such, the components of the standard stage circuits and the dummy stage circuits may have the hollow structure, so as to improve the transmittance of the components and guarantee the curing of the adhesion layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel comprising:
   a substrate, wherein a plurality of shield blocks of a shield pattern layer and a plurality of first conductor patterns are arranged in an array above the substrate;
   a plurality of standard pixel units, wherein each of the standard pixel units comprises one of the first conductor patterns and a first shield block of the shield blocks, wherein the first shield blocks and the first conductor patterns are overlapped respectively; and
   a plurality of dummy pixel units, wherein each of the dummy pixel units comprises a second shield block of the shield blocks, wherein the second shield blocks and the first conductor patterns are not overlapped, wherein a first edge of the substrate is spaced apart from a second edge of an adjacent one of the standard pixel units adjacent to the dummy pixel units by a first distance, wherein the first distance is within a range from 50 µm to 3000 µm;
   a plurality of standard stage circuits, wherein each of the standard stage circuits comprises one of a plurality of third conductor patterns, and the standard stage circuits are arranged corresponding to the standard pixel units; and
   at least one dummy stage circuit, wherein one of the at least one dummy stage circuit is arranged corresponding to one of the dummy pixel units, wherein the first edge of the substrate is spaced apart from a third edge of an adjacent one of the standard stage circuit adjacent to the at least one dummy stage circuit by a second distance, wherein the second distance is within a range from 50 µm to 3000 µm.

2. The display panel according to claim 1, wherein each of the standard pixel units further comprises one of a plurality of second conductor patterns, the first shield blocks and the second conductor patterns are overlapped respectively, the second shield blocks and the second conductor patterns are not overlapped, and each of the first conductor patterns and the second conductor patterns is a gate, a drain, or a source.

3. The display panel according to claim 1, wherein each of the standard pixel units further comprises one of a plurality of pixel electrodes, each of the first shield blocks and each of the second shield blocks respectively have a first opening and a second opening, the pixel electrodes and the first openings of the first shield blocks are overlapped respectively, and the pixel electrodes and the second openings of the second shield blocks are not overlapped.

4. The display panel according to claim 1, wherein each of the standard pixel units further comprises one of a plurality of semiconductor patterns, the first shield blocks and the semiconductor patterns are overlapped respectively, and the second shield blocks and the semiconductor patterns are not overlapped.

5. The display panel according to claim 1, wherein each of the standard pixel units further comprises one of a plurality of insulation blocks of an insulation layer, the first shield blocks and the insulation blocks are overlapped respectively, and the second shield blocks and the insulation blocks are not overlapped.

6. The display panel according to claim 1, wherein each of the standard pixel units further comprises one of a plurality of color filter patterns, each of the dummy pixel units further comprises one of the color filter patterns, the first color filter patterns are arranged respectively corresponding to the first conductor patterns, and the second color filter patterns are not arranged corresponding to the first conductor patterns.

7. The display panel according to claim 1, further comprising an adhesion layer, wherein the adhesion layer and some of the standard pixel units are overlapped.

8. The display panel according to claim 1, wherein a plurality of first standard pixel units of the standard pixel units are located in a display region, wherein the dummy pixel units and a plurality of second standard pixel units of the standard pixel units are located in a non-display region.

9. The display panel according to claim 1, further comprising a plurality of stage connection wires, wherein a first stage connection wire of the stage connection wires on the outermost side is electrically connected between one of the at least one dummy stage circuit and one of the standard stage circuits, a segment of the first stage connection wire is disposed adjacent to a clearance region, the clearance region is located between one of the at least one dummy stage circuit and an adjacent one of the standard stage circuits adjacent to the at least one dummy stage circuit, each of the standard stage circuits comprises a plurality of active devices, the active devices vacate the clearance region, a length of clearance region is within a range from 50 μm to 150 μm, and a width of the clearance region is within a range from 50 μm to 150 μm.

10. The display panel according to claim 1, further comprising a plurality of stage connection wires, wherein a second stage connection wire of the stage connection wires is electrically connected between one of the at least one dummy stage circuit and one of the standard stage circuits, the second stage connection wire has a first segment and a second segment, the first segment is located between one of the at least one dummy stage circuit and an adjacent one of the standard stage circuits adjacent to the at least one dummy stage circuit, and a line width of the first segment is less than a line width of the second segment.

11. A manufacturing method of a display panel, comprising:
providing a substrate material layer;
forming a plurality of standard pixel units and a plurality of dummy pixel units, wherein a plurality of shield blocks of a shield pattern layer and a plurality of first conductor patterns are arranged in an array above the substrate material layer, wherein each of the standard pixel units comprises one of the first conductor patterns and a first shield block of the shield blocks, wherein the first shield blocks and the first conductor patterns are overlapped respectively, wherein each of the dummy pixel units comprises a second shield block of the shield blocks, wherein the second shield blocks and the first conductor patterns are not overlapped, wherein when the standard pixel units and the dummy pixel units are formed, a plurality of standard stage circuits and at least one dummy stage circuit are formed, wherein each of the standard stage circuit comprises one of a plurality of third conductor patterns, the standard stage circuits are arranged corresponding to the standard pixel units, one of the at least one dummy stage circuit is arranged corresponding to one of the dummy pixel units; and
cutting the substrate material layer along at least one cutting surface, wherein one of the at least one cutting surface is spaced apart from a first edge of an adjacent one of the standard pixel units adjacent to the dummy pixel units by a first distance, wherein the first distance is within a range from 50 μm to 3000 μm, wherein one of the at least one cutting surface is spaced apart from a second edge of an adjacent one of the standard stage circuits adjacent to the at least one dummy stage circuit by a second distance, and the second distance is within a range from 50 μm to 3000 μm.

12. The manufacturing method according to claim 11, wherein the step of forming the standard pixel units and the dummy pixel units comprises:
forming a first conductor material layer above the substrate material layer;
forming a first photoresist material layer above the first conductor material layer;
forming a plurality of first non-exposure regions and a plurality of first exposure regions above the first photoresist material layer;
forming at least one second exposure region above the first photoresist material layer, wherein the at least one second exposure region are partially overlapped with the first non-exposure regions or the first exposure regions, the at least one cutting surface is located in the at least one second exposure region respectively, and a width of the at least one second exposure region is within a range from 0 μm to 3500 μm; and
patterning the first conductor material layer according to the first exposure regions and the at least one second exposure region, so as to form the first conductor patterns, wherein the first conductor patterns and the first non-exposure regions are of an identical shape.

13. The manufacturing method according to claim 11, wherein each of the standard pixel units further comprises one of a plurality of second conductor patterns, the first shield blocks and the second conductor patterns are overlapped respectively, the second shield blocks and the second conductor patterns are not overlapped, and each of the first conductor patterns and the second conductor patterns is a gate, a drain, or a source.

14. The manufacturing method according to claim 11, wherein each of the standard pixel units further comprises one of a plurality of pixel electrodes, each of the first shield blocks and each of the second shield blocks respectively have a first opening and a second opening, the pixel electrodes and the first openings of the first shield blocks are overlapped respectively, and the pixel electrodes and the second openings of the second shield blocks are not overlapped.

15. The manufacturing method according to claim 11, wherein each of the standard pixel units further comprises one of a plurality of semiconductor patterns, the first shield blocks and the semiconductor patterns are overlapped respectively, and the second shield blocks and the semiconductor patterns are not overlapped.

16. The manufacturing method according to claim 11, wherein each of the standard pixel units further comprises one of a plurality of insulation blocks of an insulation layer, the first shield blocks and the insulation blocks are overlapped respectively, and the second shield blocks and the insulation blocks are not overlapped.

17. The manufacturing method according to claim 11, further comprising forming an adhesion layer, wherein the adhesion layer and some of the standard pixel units are overlapped.

18. The manufacturing method according to claim 11, wherein a first stage connection wire of a plurality of stage connection wires on the outermost side is electrically connected between one of the at least one dummy stage circuit and one of the standard stage circuits, a segment of the first stage connection wire is disposed adjacent to a clearance region, the clearance region is located between one of the at least one dummy stage circuit and an adjacent one of the standard stage circuits adjacent to the at least one dummy stage circuit, each of the standard stage circuits comprises a plurality of active devices, the active devices vacate the clearance region, a length of clearance region is within a range from 50 μm to 150 μm, and a width of the clearance region is within a range from 50 μm to 150 μm.

19. The manufacturing method according to claim 11, wherein a second stage connection wire of a plurality of stage connection wires is electrically connected between one of the at least one dummy stage circuit and one of the standard stage circuits, the second stage connection wire has a first segment and a second segment, the first segment is located between one of the at least one dummy stage circuit and an adjacent one of the standard stage circuits adjacent to the at least one dummy stage circuit, and a line width of the first segment is less than a line width of the first segment.

\* \* \* \* \*